(12) United States Patent
Yoneya et al.

(10) Patent No.: US 8,415,558 B2
(45) Date of Patent: Apr. 9, 2013

(54) DYE SENSITIZATION PHOTOELECTRIC CONVERTER

(75) Inventors: Reiko Yoneya, Kanagawa (JP); Yusuke Suzuki, Kanagawa (JP); Masahiro Morooka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/223,562

(22) PCT Filed: Jan. 31, 2007

(86) PCT No.: PCT/JP2007/051554
§ 371 (c)(1),
(2), (4) Date: Jan. 8, 2009

(87) PCT Pub. No.: WO2007/088871
PCT Pub. Date: Aug. 9, 2007

(65) Prior Publication Data
US 2009/0217979 A1   Sep. 3, 2009

(30) Foreign Application Priority Data

Feb. 2, 2006  (JP) .................................. 2006-025275
Dec. 26, 2006 (JP) .................................. 2006-348822

(51) Int. Cl.
*H01M 14/00* (2006.01)
*H01L 31/04* (2006.01)

(52) U.S. Cl.
USPC ........... 136/263; 136/243; 136/244; 136/245; 136/246; 136/247; 136/248; 136/249; 136/250; 136/251; 136/252; 136/253; 136/254; 136/255; 136/256; 136/257; 136/258; 136/259; 136/260; 136/261; 136/262; 136/264; 136/265

(58) Field of Classification Search ........... 136/243–265
See application file for complete search history.

(56) References Cited

U.S. PATENT DOCUMENTS

| 2003/0152827 A1* | 8/2003 | Ikeda et al. ................. 429/111 |
| 2004/0187918 A1* | 9/2004 | Ikeda et al. ................. 136/263 |

(Continued)

FOREIGN PATENT DOCUMENTS

| EP | 1020881 | * | 7/2000 |
| JP | 2664194 B2 | | 9/1989 |

(Continued)

OTHER PUBLICATIONS

B.O'Regan et al., "A low-cost, high-efficiency solar cell based on dye-sensitized colloidal TiO2 films 737", Nature, Oct. 24, 1991, p. 737-740, vol. 353.

(Continued)

*Primary Examiner* — Brian P Mruk
(74) *Attorney, Agent, or Firm* — Wolf, Greenfield & Sacks, P.C.

(57) ABSTRACT

A dye-sensitized photoelectric converter with enhanced light absorptance and photoelectric conversion efficiency is provided. The dye-sensitized photoelectric converter includes a transparent substrate (e.g., glass), a (negative) electrode composed of a transparent conductive layer such as FTO (fluorine-doped tin(IV) oxide $SnO_2$), a semiconductor layer holding multiple types of photosensitizing dyes, an electrolyte layer, a counter (positive) electrode, a counter substrate, and a sealing medium (not illustrated). In some embodiments, the multiple types of photosensitizing dyes have minimum excitation energies that are different from one another. In some embodiments, the multiple types of dyes have steric configurations that are different relative to one another.

17 Claims, 9 Drawing Sheets

U.S. PATENT DOCUMENTS

| | | |
|---|---|---|
| 2005/0166957 A1 | 8/2005 | Imoto et al. |
| 2005/0263182 A1 | 12/2005 | Morooka et al. |
| 2006/0130895 A1* | 6/2006 | Gaudiana et al. ............ 136/263 |
| 2007/0172737 A1 | 7/2007 | Nakayama et al. |
| 2007/0175510 A1 | 8/2007 | Morooka et al. |
| 2008/0083452 A1 | 4/2008 | Morooka et al. |
| 2009/0007961 A1 | 1/2009 | Morooka |
| 2009/0068568 A1 | 3/2009 | Yamamoto et al. |
| 2009/0272433 A1 | 11/2009 | Morooka et al. |
| 2010/0101648 A1 | 4/2010 | Morooka et al. |
| 2010/0108135 A1 | 5/2010 | Morooka et al. |
| 2010/0116340 A1 | 5/2010 | Yoneya et al. |
| 2010/0132785 A1 | 6/2010 | Morooka et al. |
| 2010/0136438 A1 | 6/2010 | Nakayama et al. |
| 2010/0144083 A1 | 6/2010 | Suzuki et al. |
| 2010/0196762 A1 | 8/2010 | Yamamoto et al. |
| 2010/0243055 A1 | 9/2010 | Yoneya et al. |
| 2010/0248418 A1 | 9/2010 | Morooka et al. |
| 2011/0048525 A1 | 3/2011 | Yoneya et al. |
| 2011/0083719 A1 | 4/2011 | Takada et al. |
| 2011/0132461 A1 | 6/2011 | Orihashi et al. |
| 2011/0155223 A1 | 6/2011 | Morooka et al. |
| 2011/0171536 A1 | 7/2011 | Oki et al. |
| 2011/0214739 A1 | 9/2011 | Tsuda et al. |
| 2011/0226325 A1 | 9/2011 | Morooka et al. |
| 2011/0240086 A1 | 10/2011 | Morooka et al. |
| 2011/0240116 A1 | 10/2011 | Morooka |
| 2011/0277818 A1 | 11/2011 | Shimura |
| 2011/0277832 A1 | 11/2011 | Shimizu et al. |
| 2011/0315213 A1 | 12/2011 | Takada et al. |

FOREIGN PATENT DOCUMENTS

| | | |
|---|---|---|
| JP | 2000-195569 A | 7/2000 |
| JP | 2000-268892 A | 9/2000 |
| JP | 2003-059547 A | 2/2003 |
| JP | 2003-086257 A | 3/2003 |
| JP | 2003-282165 A | 10/2003 |
| JP | 2004-022222 A | 1/2004 |
| JP | 2004-022387 A | 1/2004 |
| JP | 2004-141758 A | 5/2004 |
| JP | 2005-298317 A | 10/2005 |
| JP | 2006-185911 A | 7/2006 |
| WO | WO 02/11213 A1 | 2/2002 |

OTHER PUBLICATIONS

K. Hara et al., "Electron Transport in Coumarin-Dye-Sensitized Nanocrystalline TiO2 Electrodes", Journal of Physical Chemistry B, Nov. 25, 2005, p. 23776-23778, vol. 109 No. 50.

Yanagida et al., "The electron transport process in ruthenium-bipyride complex dye and ruthenium-biquinoline complex dye sensitized nanocrystalline titanium oxide electrode" Photochemistry Conference, 2005.

Yanagida et al., "Panchromatic Sensitization of Nanocrystalline TiO2 with cis-Bis(4-carboxy-2-[2'-(4'-carboxypyridyl)]quinoline)bis(thiocyanato-N)ruthenium(II)", Inorganic Chemistry, 2003, p. 7921-7931, vol. 42 No. 24.

Uchida "Theoritical effeciency of dye sensitized solar cell" http://kuroppe.tagan.tohoku.ac.jp/~dsc/cell.html.

* cited by examiner

BLACK DYE

DYE A

N719

DYE B

α-CYANOCINNAMIC ACID USED IN EXAMPLE 5

STRUCTURAL FORMULA OF
PHENYLTHIOHYDANTOIN-TRYPTOPHAN USED IN EXAMPLE 6

CHENODEOXYCHOLIC ACID USED IN COMPARATIVE EXAMPLE 3

DYE SENSITIZATION PHOTOELECTRIC CONVERTER

TECHNICAL FIELD

The present invention relates to a dye sensitization photoelectric converter capable of being used as a solar cell, etc., and in detail, the present invention relates to a dye sensitization photoelectric converter with high light absorptance and photoelectric conversion efficiency.

BACKGROUND ART

Solar cells utilizing sunlight are watched as energy sources to replace fossil fuels, and various studies have been made. The solar cells are a sort of photoelectric converters for converting light energy into electric energy and use sunlight as an energy source. Therefore, the solar cells are extremely small in influences against the global environment, and much more diffusion thereof is being expected.

As to the principle and materials of solar cells, various investigations have been made. Above all, solar cells utilizing pn junction of a semiconductor are most diffused at present, and a number of solar cells containing silicon as a semiconductor material are commercially available. These are roughly classified into a crystalline silicon based solar cell using monocrystalline or polycrystalline silicon and an amorphous silicon based solar cell using amorphous silicon.

As to the photoelectric conversion efficiency expressing the performance for converting light energy of sunlight into electric energy, the crystalline silicon based solar cell is higher than the amorphous silicon based solar cell, and therefore, the crystalline silicon based solar cell has hitherto been frequently used for the solar cell. But, since the crystalline silicon based solar cell requires a lot of energy and time for the crystal growth, the productivity is low, leading to high costs.

On the other hand, the amorphous silicon based solar cell has characteristics such that it is able to absorb and use light in a wider wavelength region as compared with the crystalline silicon based solar cell; and it is able to choose a substrate material of every kind so that it is easy to realize a large area. Also, the amorphous silicon based solar cell does not require crystallization so that it can be manufactured with good productivity and at low costs as compared with the crystalline silicon based solar cell. But, its photoelectric conversion efficiency is lower than that of the crystalline silicon based solar cell.

In all of these silicon based solar cells, since a step of manufacturing a high-purity semiconductor material and a step of forming pn junction are needed, there is involved a problem that the number of manufacturing steps becomes large; and since a manufacturing step under vacuum is needed, there is involved a problem that the equipment costs and energy costs are high.

In order to realize a solar cell which is free from the foregoing problems and which can be manufactured at lower costs, solar cells using an organic material in place of the silicon based material have been long studied. But, in the majority of them, the photoelectric conversion efficiency is low as about 1% so that they have not been put to practice use yet.

However, a dye sensitization photochemical battery (photoelectric converter) applying photoinduced electron transfer was proposed in 1991 (see, B. O'Regan, M. Graetzel, *Nature*, 353, pages 737 to 740 (1991) and Japanese Patent No. 2664194 (pages 2 and 3 and FIG. 1), etc.). Since this photoelectric converter has high photoelectric conversion efficiency, does not require a massive manufacturing system and can be simply manufactured with good productivity using cheap materials, it is expected as a next-generation solar cell.

FIG. 10 is a cross-sectional view of the principal part illustrating a structure of an existing general dye sensitization photoelectric converter 100. The dye sensitization photoelectric converter 100 is mainly configured of a transparent substrate 1 such as glass, a transparent electrode (negative electrode) 2 composed of a transparent conductive layer such as FTO (fluorine-doped tin(IV) oxide $SnO_2$), a semiconductor layer 103 holding a single kind of a photosensitizing dye, an electrolyte layer 5, a counter electrode (positive electrode) 6, a counter substrate 7 and a (non-illustrated) sealing medium, etc.

As the semiconductor layer 103, a porous layer obtained by sintering fine particles of titanium oxide $TiO_2$ is frequently used. A single kind of a photosensitizing dye is held on the surface of the fine particles configuring this semiconductor layer 103. The electrolyte layer 5 is filled between the semiconductor layer 103 and the counter electrode 6, and an organic electrolytic liquid containing an oxidation-reduction species (redox pair) such as $I^-/I_3^-$ is used. The counter electrode 6 is configured of a platinum layer 6b, etc. and formed on the counter substrate 7.

FIG. 11 is an energy diagram for explaining the actuation principle of the dye sensitization photoelectric converter 100. When light is made incident, the dye sensitization photoelectric converter 100 is actuated as a cell in which the counter electrode 6 acts as a positive electrode, and the transparent electrode 2 acts as a negative electrode. Its principle is as follows. (In FIG. 11, it is supposed that FTO is used as a material of the transparent electrode 2; N719 as described later is used as a photosensitizing dye 104; titanium oxide $TiO_2$ is used as a material of the semiconductor layer 103; and an oxidation-reduction species of $I^-/I_3^-$ is used as the redox pair.)

When the photosensitizing dye 104 absorbs a photon which has transmitted through the transparent substrate 1 and the transparent electrode 2, an electron in the photosensitizing dye 104 is excited from a ground state (HOMO) to an excited state (LUMO). The electron in an excited state is drawn out into a conduction band of the semiconductor layer 103 via electrical coupling between the photosensitizing dye 104 and the semiconductor layer 103 and passes through the semiconductor layer 103 to reach the transparent electrode 2.

On the other hand, the photosensitizing dye 104 which has lost an electron receives an electron from a reducing agent in the electrolyte layer 5, for example $I^-$, according to the following reaction:

forms an oxidizing agent, for example, $I_3^-$ (coupled body of $I_2$ and $I^-$) in the electrolyte layer 5. The formed oxidizing agent reaches the counter electrode 6 due to diffusion and receives an electron from the counter electrode 6 according to the following reaction which is a reverse reaction to the foregoing reaction:

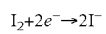

and is reduced to the original reducing agent.

The electron which has been sent out from the transparent electrode 2 to an external circuit electrically works in the external circuit and then returns to the counter electrode 6. In this way, the light energy is converted into the electric energy without leaving any change in both the photosensitizing dye 104 and the electrolyte layer 5.

As the photosensitizing dye 104 of the dye sensitization photoelectric converter 100, substances capable of absorbing light in the vicinity of a visible light region, for example, bipyridine complexes, terpyridine complexes, merocyanine dyes, porphyrin, phthalocyanine, etc. are usually used.

In general, in order to realize high photoelectric conversion efficiency, it has hitherto been considered to be favorable to use a single kind of a dye with high purity. This is because it is considered that in the case where plural kinds of dyes are intermingled on the single semiconductor layer 103, transfer of an electron between the dyes each other or recoupling between an electron and a hole occurs, or an electron which has been transferred from an excited dye to the semiconductor layer 103 is captured by a dye of a different kind, whereby an electron reaching the transparent electrode 2 from the excited photosensitizing dye 104 decreases, and a ratio for obtaining current from the absorbed photon, namely a quantum yield remarkably lowers (see, for example, K. Hara, K. Miyamoto, Y. Abe, M. Yanagida, *Journal of Physical Chemistry B*, 109 (50), pages 23776 to 23778 (2005), "Electron Transport in Coumarin-Dye-Sensitized Nanocrystalline $TiO_2$ Electrodes"; Masatoshi Yanagida, et al., *Symposium on Photochemistry* (2005), 2P132, "Electron Transport Process in Dye-Sensitized Nanocrystalline Titanium Oxide Electrodes Having Ruthenium Bipyridine Comlex and Ruthenium Biquinoline Complex Coadsorbed Thereon"; Uchida, http://kuroppe.tagen.tohoku.ac.jp/~dsc/cell.html, FAQ, "Re: Theoretical Efficiency of Dye-Sensitized Solar Cells"; etc.).

As the dye to be used singly, a cis-bis(isothiocyanate)bis (2,2'-bipyridyl-4,4'-dicarboxylate)ruthenium(II) ditetrabutylammonium complex (commonly called as "N719") which is a sort of bipyridine complexes is excellent in performance as the sensitizing dye and is generally used. Besides, cis-bis (isothiocyanato)bis(2,2'-bipyridyl-4,4'-dicarboxylate)ruthenium(II) (commonly called as "N3") which is a sort of bipyridine complexes and a tris(isothiocyanato)(2,2':6',2"-terpyridyl-4,4',4"-tricarboxylate)ruthenium(II) tritetrabutylammonium complex (commonly called as "Black Dye") which is a sort of terpyridine complexes are generally used.

In particular, when N3 or Black Dye is used, a coadsorbent is frequently used. The coadsorbent is a molecule which is added for the purpose of preventing association of a dye molecule on the semiconductor layer 103 from occurring, and representative examples of the coadsorbent include chenodeoxycholic acid, taurodeoxycholic acid salts and 1-decrylphosphonic acid. Examples of structural characteristics of these molecules include the matter that they have a carboxyl group, a phosphono group, etc. as a functional group which is easily adsorbed on titanium oxide constituting the semiconductor layer 103; and the matter that in order that they may lie between dye molecules to prevent interference between the dye molecules, they are formed by a σ-bond.

In general, in order to effectively actuate a photoelectric converter, first, it is important to enhance the light absorptance such that light coming into the photoelectric converter can be utilized at a maximum; and next, it is important to enhance the conversion efficiency for converting absorbed light energy into electric energy. In a dye sensitization photoelectric converter, since the light absorption is borne by the photosensitizing dye 104, it is expected that the maximum light absorptance can be realized by choosing, as the photosensitizing dye 104, a dye having optimal light absorbing properties against the incident light.

Since sunlight includes lights with various wavelengths continuously from infrared light to ultraviolet light, when applied as a solar cell, in order to realize a high light absorptance, it is desirable to choose a dye capable of absorbing exhaustively light of a wavelength region over the range as wide as possible including a long-wavelength region, especially light having a wavelength of from 300 to 900 nm.

However, the state of the electron in the photosensitizing dye 104 is quantum mechanically determined, and energy states other than that inherent to its substance cannot be taken. In consequence, a difference in energy between the electron in a ground state (HOMO) and the electron in an excited state (LUMO), namely energy (band gap energy) necessary for exciting the electron from the ground state to the excited state, is also determined as a value inherent to its substance, and the light which the photosensitizing dye 104 is able to absorb corresponding thereto is restricted to light in a specified wavelength region. Also, in order that the excited electron may be able to move into a conduction band of the semiconductor layer 103, it is required that the band gap energy of the dye does not become too small.

FIG. 12(*a*) is a graph showing absorption spectra of four kinds of representative dyes which are generally available at present; and FIG. 12(*b*) is a graph showing enlarged absorption spectra of three kinds of dyes having a small molar absorption coefficient. It is noted from FIG. 12 that Black Dye has a wide-ranging absorption wavelength region including a long-wavelength end in the vicinity of 860 nm. But, its molar absorption coefficient is small as a whole, and in particular, a region where the absorbance is insufficient is present on the short-wavelength side. Though N719 has a molar absorption coefficient equal to or more than Black Dye on the short-wavelength side, its long-wavelength side end of the absorption wavelength region is present in the vicinity of 730 nm, and light having a long wavelength cannot be effectively utilized. The light absorption by 5-[[4-[4-(2,2-diphenylethenyl)phenyl]-1,2,3,3a,4,8b-hexahydrocyclopent[b]indol-7-yl]methylene]-2-(3-ethyl-4-oxo-2-thioxo-5-thiazolidinylidene)-4-oxo-3-thiazolidineacetic acid (hereinafter referred to as "Dye B") has wavelength dependency substantially the same as N719, and its molar absorption coefficient is smaller than that of N719. Though 2-cyano-3-[4-[4-(2,2-diphenylethenyl)phenyl]-1,2,3,3a,4,8b-hexahydrocyclopent [b]indol-7-yl]-2-propenoic acid (hereinafter referred to as "Dye A") has a large molar absorption coefficient, its absorption wavelength region is restricted narrow.

As described previously, a dye which is able to exhaustively absorb sunlight having a wavelength of from 300 to 900 nm does not exist at present. In the case where the dye sensitization photoelectric converter 100 is used as a solar cell, the maximum performance is achieved in the case of using N719 as the photosensitizing dye 104, and for example, a performance of 0.755 V in open-circuit voltage and 8.23% in photoelectric conversion efficiency is obtained. When this result is compared with a performance of 0.6 V in open-circuit voltage and 15% in photoelectric conversion efficiency as achieved in a crystalline silicon based solar cell, the photoelectric conversion efficiency is no more than a little over a half.

Taking into consideration the matter that the dye sensitization photoelectric converter 100 is larger in the open-circuit voltage than the crystalline silicon based solar cell, it is considered that the reason why the photoelectric conversion efficiency of the dye sensitization solar cell is low resides in the matter that the obtained photocurrent is remarkably small as compared with that in the crystalline silicon based solar cell; and that its primary cause resides in the matter that the light absorptance by the photosensitizing dye 104 is insufficient. That is, it is considered that since a dye which is able to efficiently absorb all lights with various wavelengths to be included in sunlight does not exist, the light absorptance is insufficient in the dye sensitization solar cell composed of a single kind of a dye.

If sufficient light absorption cannot be realized in a single kind of a dye, it may be considered to use plural kinds of dyes having different absorption wavelength properties from each other as a photosensitizing dye. However, as described previously, when plural kinds of dyes are intermingled on the single semiconductor layer 103 and used, the photoelectric conversion efficiency is actually lowered in almost all of cases. This is because as described previously, a ratio for obtaining current from the absorbed photon by the electron transfer between the dyes or the like, namely a quantum yield remarkably lowers.

In view of the foregoing circumstances, the present invention has been made, and its object is to provide a dye sensitization photoelectric converter with enhanced light absorptance and photoelectric conversion efficiency.

DISCLOSURE OF THE INVENTION

As a result of extensive and intensive investigations, the present inventors have found a combination of plural kinds of dyes capable of enhancing light absorptance and photoelectric conversion efficiency and led to accomplishment of a first invention of the present invention.

Specifically, the present invention is concerned with a first dye sensitization photoelectric converter configured such that light is absorbed by a photosensitizing dye held in a semiconductor layer and that an electron of the photosensitizing dye excited by this light absorption is taken out to the outside via the semiconductor layer, which is characterized in that the photosensitizing dye is composed of plural kinds of dyes and exhibits photoelectric conversion efficiency of at least the addition of photoelectric conversion efficiency in the case of using each of these dyes singly.

Also, it has been found that in the foregoing dye sensitization photoelectric converter, in studying the mechanism where the photoelectric conversion efficiency is enhanced by a combination of plural kinds of dyes, in the case where at least one of plural kinds of dye molecules has plural functional groups bound to the semiconductor layer on the same carbon, this dye controls association with a dye of a different kind from this dye, thereby enhancing the photoelectric conversion efficiency of the dye of that different kind, leading to accomplishment of a second invention of the present invention.

Specifically, the present invention is concerned with a second dye sensitization photoelectric converter configured such that light is absorbed by a photosensitizing dye held in a semiconductor layer and that an electron of the photosensitizing dye excited by this light absorption is taken out to the outside via the semiconductor layer, which is characterized in that plural kinds of molecules are held in the semiconductor layer;

that at least one of the plural kinds of molecules is the photosensitizing dye; and that at least one of the plural kinds of molecules is a molecule having plural functional groups bound to the semiconductor layer on the same carbon and controlling association of the photosensitizing dye, thereby enhancing photoelectric conversion efficiency of the photosensitizing dye.

The molecule having plural functional groups bound to the semiconductor layer on the same carbon may be a single kind of the photosensitizing dye per se as in the origin of the invention, or different from that, it may be a molecule not having a photoelectric conversion function.

The first dye sensitization photoelectric converter of the present invention is characterized in that the photosensitizing dye is composed of plural kinds of dyes and exhibits photoelectric conversion efficiency of at least the addition of photoelectric conversion efficiency in the case of using each of these dyes singly.

In order to enhance the photoelectric conversion efficiency of a dye sensitization photoelectric converter, it has hitherto been considered to be a rule to use a single kind of a dye with high purity. On the contrary to that common knowledge, the present inventors have experimentally clarified that in the case where plural kinds of dyes are intermingled on the semiconductor layer, a combination of dyes exhibiting photoelectric conversion efficiency of at least the addition of photoelectric conversion efficiency in the case of using each of these dyes singly is present.

In the first dye sensitization photoelectric converter of the present invention, since the photosensitizing dye is composed of such a combination of the plural kinds of dyes, these dyes do not lower a mutual quantum yield, a photoelectric conversion function due to the plural kinds of dyes is exhibited, and the generation amount of current is largely increased. As a result, in comparison with the case of using each of these dyes singly, it is possible to enhance the light absorptance and to realize photoelectric conversion efficiency of at least the addition of photoelectric conversion efficiency in the case of using each of these dyes singly.

As an apparatus aiming to enhance the photoelectric conversion efficiency through a combination of plural kinds of dyes, there has hitherto been proposed a tandem type dye sensitization photoelectric converter in which dye sensitization photoelectric conversion devices holding each of dyes singly in a semiconductor layer are prepared, and these devices are stacked in the transmission direction of light (JP-A-H11-273753 and JP-A-2000-90989, etc.). In the tandem type dye sensitization photoelectric converter, since incident light first comes into the photoelectric conversion device on the near side to the incident light, is dimmed herein due to absorption, reflection or scattering and then comes into the photoelectric conversion device on the far side from the incident light, there is a problem that the dye of the photoelectric conversion device on the far side from the incident light cannot receive the incident light under a good condition. On the other hand, the dye sensitization photoelectric converter of the present invention has an advantage that all the dyes are able to receive incident light under the same good condition.

The second dye sensitization photoelectric converter of the present invention is characterized in that plural kinds of molecules are held in the semiconductor layer;

that at least one of the plural kinds of molecules is the photosensitizing dye; and that at least one of the plural kinds of molecules is a molecule having plural functional groups bound to the semiconductor layer on the same carbon and controlling association of the photosensitizing dye, thereby enhancing photoelectric conversion efficiency of the photosensitizing dye.

It is considered that the molecule having plural functional groups on the same carbon (the molecule will be hereinafter referred to as "association controlling molecule") is bound to the semiconductor layer by these functional groups to take a different steric configuration from the photosensitizing dye and adsorbed on the semiconductor layer. For that reason, even when the foregoing molecule is adjacent to the photosensitizing dye on the surface of the semiconductor layer, it can exist without exerting a strong mutual action to the photosensitizing dye so that it does not hinder a photoelectric conversion performance of the photosensitizing dye.

On the other hand, the association controlling molecule held on the surface of the semiconductor layer effectively lies between the photosensitizing dyes held on the same surface of the semiconductor layer and controls the association of the photosensitizing dyes each other, thereby preventing useless electron transfer between the photosensitizing dyes. For that reason, the excited electron does not uselessly transfer between the dyes from the photosensitizing dye having light absorbed therein and is effectively taken out into the semiconductor layer, whereby the photoelectric conversion efficiency is enhanced.

As a result, the second dye sensitization photoelectric converter of the present invention is able to greatly enhance IPCE (incident photon-to-current conversion efficiency) and a short-circuit current value at the time of irradiation of artificial sunlight as compared with the existing dye sensitization photoelectric convertor using a coadsorbent such as chenodeoxycholic acid.

BEST MODES FOR CARRYING OUT THE INVENTION

Figure 1:
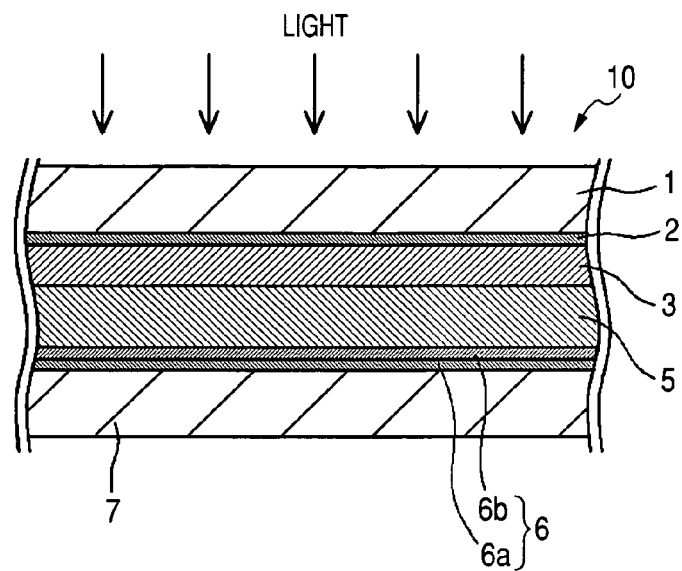
FIG. 1 is a cross-sectional view of the principal part illustrating a structure of a dye sensitization photoelectric converter according to Embodiment 1 of the present invention.

In the first dye sensitization photoelectric converter of the present invention, it is desirable that minimum excitation energy of each of the foregoing plural kinds of dyes from a ground state (HOMO) to an excited state (LUMO) sufficiently differs from each other. On that occasion, it is preferable that the minimum excitation energy of each of the foregoing plural kinds of dyes differs by 0.172 to 0.209 eV or more.

Also, it is desirable that the foregoing plural kinds of dyes are composed of one whose maximum absorption band is present in a wavelength region of 400 nm or more and one whose maximum absorption band is present in a wavelength region of not more than 400 nm.

Also, it is desirable that the foregoing plural kinds of dyes are composed of a dye having a large quantum yield in a visible light region and a dye having a small quantum yield in a visible light region.

Also, it is desirable that the foregoing plural kinds of dyes are composed of a dye having a large molar absorption coefficient and a dye having a small molar absorption coefficient. On that occasion, it is desirable that the molar absorption coefficient of the dye having a large molar absorption coefficient is 100,000 or more and that the molar absorption coefficient of the dye having a small molar absorption coefficient is not more than 100,000.

Also, it is desirable that the foregoing plural kinds of dyes are held in a different steric configuration from each other in the semiconductor layer. For example, it is desirable that the foregoing plural kinds of dyes are composed of an inorganic complex dye having properties for causing MLCT (metal to ligand charge transfer) and an organic molecule dye having intramolecular CT (charge transfer) properties. Examples of the inorganic complex dye having properties for causing MLCT include polypyridine complexes such as Black Dye and N719; and examples of the organic molecule dye having intramolecular CT properties include aromatic polycyclic conjugated molecules in which an electron donating group and an electron accepting group are linearly disposed, such as Dye A.

The "organic molecule having intramolecular CT properties" as referred to herein refers to a molecule having both an electron donating group and an electron accepting group in the same molecule. Furthermore, in adsorbing this molecule on the surface of a semiconductor layer 3 such as titanium oxide, when an electron accepting group is disposed on the side of the semiconductor layer 3, and an electron donating group is disposed on the side of an electrolyte layer 5, the molecule acts advantageously on the transfer of an electron from the dye to the semiconductor layer 3. Therefore, it is desirable that this molecule is a molecule having such a structure. This is because the transfer method and transfer direction of a charge in the organic molecule dye having CT properties are different from the transfer method and transfer direction of a charge in the inorganic complex dye for causing MLCT.

Examples of the inorganic complex dye having properties for causing MLCT include polypyridine complexes such as bipyridine complexes, biquinoline complexes and terpyridine complexes, for example, Black Dye and N719. The organic molecule dye having CT properties is an organic molecule having, as an electron accepting group, a partial structure such as thiophene, rhodanine, a cyano group and carbazole and having, as an electron donating group, a partial structure such as naphthoquinone, a pyridyl group and a pyrimidyl group. Specifically, a tetrathiafulvalene-tetracyanoquinodimethane (TTF-TCNQ) complex, asymmetric azo dyes, thiazole azo dyes, azulene and the like can be exemplified; and more specifically, Dye A and the like can be exemplified (see Makoto Okawara, Masaru Matsuoka, Tsuneaki Hirashima, Teijiro Kitao, *Kinosei Shikiso* (Functional Dyes) (Kodansha Ltd.)).

Also, it is desirable that the configuration is made in such a manner that at least one of the foregoing plural kinds of dyes has plural functional groups bound to the semiconductor layer on the same carbon and that this dye controls association with at least one of the plural kinds of dyes of a different kind from this dye, thereby enhancing the photoelectric conversion efficiency of the dye of that different kind. This dye is bound to the semiconductor layer by the foregoing plural functional groups present on the same carbon and takes a different steric configuration different from that of the foregoing dye of a different kind to be adsorbed by only a single functional group, whereby it is adsorbed on the semiconductor layer. For that reason, even when this dye and the dye of a different kind are adjacent to each other on the surface of the semiconductor layer, they can coexist without exerting a strong mutual action and do not hinder the mutual photoelectric conversion performance. On the other hand, this dye molecule effectively lies between the photosensitizing dyes held on the same surface of the semiconductor layer and controls the association of at least one of the plural kinds of dyes of a different kind, thereby preventing useless electron transfer between the dyes of a different kind. For that reason, the excited electron does not uselessly transfer between the dyes from the dye of a different kind having light absorbed therein and is effectively taken out into the semiconductor layer, whereby the photoelectric conversion efficiency of the dye of a different kind is enhanced.

On that occasion, it is desirable that the foregoing plural functional groups which this dye has on the same carbon are composed of a functional group which is strongly bound to the semiconductor layer and a functional group which is weakly bound to the semiconductor layer. If the foregoing plural functional groups which this dye has on the same carbon are all a functional group which is strongly bound to the semiconductor layer, the steric configuration of this dye adsorbed on the semiconductor layer is low in degree of freedom so that the effect that the foregoing plural functional groups are present on the same carbon is hardly exhibited. On the other hand, since the foregoing plural functional groups which this dye has are composed of a functional group to be strongly bound to the semiconductor layer and a functional group to be weakly bound, the functional group to be weakly bound auxiliarily functions and does not disturb binding of the functional group to be strongly bound to the semiconductor layer. As a result, the effect that the foregoing plural functional groups are present on the same carbon is effectively exhibited. Also, since the excited electron of this dye having light absorbed therein is taken out to the semiconductor layer from the functional group to be strongly bound, the charge transfer to the semiconductor layer is effectively performed.

For example, it is desirable that the functional group which is strongly bound to the semiconductor layer is a carboxyl group —COOH or a phosphono group —$PO(OH)_2$, whereas the functional group which is weakly bound to the semiconductor layer is a cyano group —CN, an amino group —$NH_2$, a thiol group —SH or a thione group —CS—.

In the second dye sensitization photoelectric converter of the present invention, it is desirable that the foregoing plural functional groups which the association controlling molecule has on the same carbon are composed of a functional group which is strongly bound to the semiconductor layer and a functional group which is weakly bound to the semiconductor layer. If the foregoing plural functional groups which the association controlling molecule has on the same carbon are all a functional group which is strongly bound to the semiconductor layer, the steric configuration to be taken by the association controlling molecule adsorbed on the semiconductor layer is low in degree of freedom so that the effect that the foregoing plural functional groups are present is hardly exhibited. On the other hand, since the foregoing plural functional groups which the association controlling molecule has are composed of a functional group to be strongly bound to the semiconductor layer and a functional group to be weakly bound, the functional group to be weakly bound auxiliarily functions and does not disturb binding of the functional group to be strongly bound to the semiconductor layer. As a result, the effect that the foregoing plural functional groups are present on the same carbon is effectively exhibited.

For example, it is desirable that the functional group which is strongly bound to the semiconductor layer is a carboxyl group —COOH or a phosphono group —$PO(OH)_2$, whereas the functional group which is weakly bound to the semiconductor layer is a cyano group —CN, an amino group —$NH_2$, a thiol group —SH or a thione group —CS—.

Details of the dye sensitization photoelectric converter on the basis of embodiments of the present invention are hereunder specifically described with reference to the accompanying drawings.

Embodiment 1

FIG. 1 is a cross-sectional view of the principal part illustrating a structure of a dye sensitization photoelectric converter 10 on the basis of Embodiment 1, which is chiefly corresponding to the first dye sensitization photoelectric converter set forth in claim 1. The dye sensitization photoelectric converter 10 is chiefly configured of a transparent substrate 1 such as glass, a transparent electrode (negative electrode) 2 composed of a transparent conductive layer such as FTO (fluorine-doped tin(IV) oxide $SnO_2$), a semiconductor layer 3 holding plural kinds of photosensitizing dyes, an electrolyte layer 5, a counter electrode (positive electrode) 6, a counter substrate 7 and a non-illustrated sealing medium, etc.

As the semiconductor layer 3, a porous layer obtained by sintering fine particles of titanium oxide $TiO_2$ is frequently used. Plural kinds of photosensitizing dyes are held on the surface of the fine particles configuring this semiconductor layer 3. The electrolyte layer 5 is filled between the semiconductor layer 3 and the counter electrode 6, and an organic electrolytic liquid containing an oxidation-reduction species (redox pair) such as $I^-/I_3^-$ or the like is used. The counter electrode 6 is configured of a platinum layer 6b, etc. and formed on the counter substrate 7.

The dye sensitization photoelectric converter 10 does not differ from the existing dye sensitization photoelectric convertor 100, except that the photosensitizing dye is composed of plural kinds of dyes having sufficiently different minimum excitation energy from each other or is composed of plural kinds of dyes to be held in a different steric configuration from each other in the semiconductor layer 3.

Figure 2:
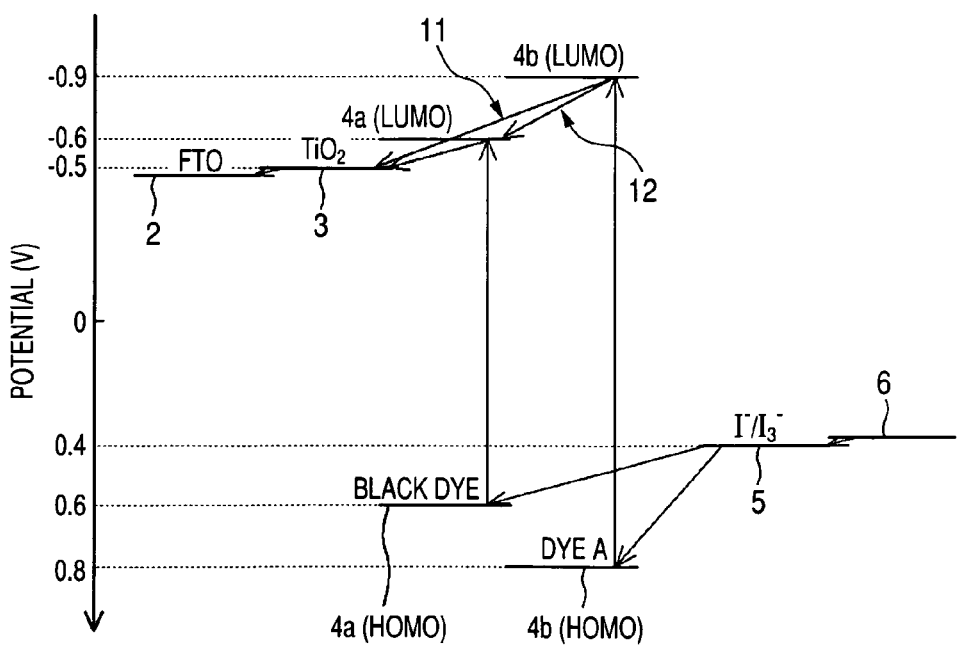
FIG. 2 is an energy diagram for explaining the actuation principle of a dye sensitization photoelectric converter according to Embodiment 1 of the present invention.

FIG. 2 is an energy diagram for explaining the actuation principle of the dye sensitization photoelectric converter 10. When light is made incident, the dye sensitization photoelectric converter 10 is actuated as a cell in which the counter electrode 6 acts as a positive electrode, and the transparent electrode 2 acts as a negative electrode. Its principle is as follows. (In FIG. 2, it is supposed that FTO is used as a material of the transparent electrode 2; Black Dye and Dye A are used as a photosensitizing dye 4; titanium oxide $TiO_2$ is used as a material of the semiconductor layer 3; and an oxidation-reduction species of $I^-/I_3^-$ is used as the redox pair.)

When the photosensitizing dye 4 absorbs a photon which has transmitted through the transparent substrate 1, the transparent electrode 2 and the semiconductor layer 3, an electron in the photosensitizing dye 4 is excited from a ground state (HOMO) to an excited state (LUMO). On that occasion, in the dye sensitization photoelectric converter 10, since the photosensitizing dye 4 is composed of plural kinds of dyes, for example, two kinds of a dye 4a and a dye 4b, it is possible to absorb light in a wider wavelength region in a higher light absorptance as compared with the existing dye sensitization photoelectric converter 100 in which the photosensitizing dye is composed of a single dye.

The electron in an excited state is drawn out into a conduction band of the semiconductor layer 3 via electrical coupling between the photosensitizing dye 4 and the semiconductor layer 3 and passes through the semiconductor layer 3 to reach the transparent electrode 2. On that occasion, since the plural kinds of dyes constituting the photosensitizing dye 4, for example, Black Dye and Dye A are composed of plural kinds of dyes having sufficiently different minimum excitation energy from each other or are composed of plural kinds of dyes to be held in a different steric configuration from each other in the semiconductor layer 3, these dyes do not lower a mutual quantum yield, a photoelectric conversion function due to the plural kinds of dyes is exhibited, and the generation amount of current is largely increased.

On the other hand, the photosensitizing dye 4 which has lost an electron receives an electron from a reducing agent in the electrolyte layer 5, for example $I^-$, according to the following reaction:

$$2I^- \rightarrow I_2 + 2e^-$$

$$I_2 + I^- \rightarrow I_3^-$$

and forms an oxidizing agent, for example, $I_3^-$ (coupled body of $I_2$ and $I^-$) in the electrolyte layer 5. The formed oxidizing agent reaches the counter electrode 6 due to diffusion and receives an electron from the counter electrode 6 according to the following reaction which is a reverse reaction to the foregoing reaction:

$$I_3^- \rightarrow I_2 + I^-$$

$$I_2 + 2e^- \rightarrow 2I^-$$

and is reduced to the original reducing agent.

The electron which has been sent out from the transparent electrode 2 to an external circuit electrically works in the external circuit and then returns to the counter electrode 6. In this way, the light energy is converted into the electric energy without leaving any change in both the photosensitizing dye 4 and the electrolyte layer 5.

The respective dyes of the foregoing plural kinds of dyes constituting the photosensitizing dye 4 are not particularly limited so far as they exhibit a sensitizing action. However, in order that these dyes may be adsorbed on the semiconductor layer 3, an acid functional group is necessary, a dye having a carboxyl group —COOH or a phosphono group —PO(OH)$_2$ is preferable, and a dye having a carboxyl group is especially preferable.

As a result of extensive and intensive investigations regarding various combinations of dyes, the present inventors have found a combination of dyes capable of enhancing light absorptance and photoelectric conversion efficiency. That is, in the case of combining a dye having a small molar absorption coefficient but a wide absorption wavelength region, for example, Black Dye, N719, Dye B, etc. (this dye will be hereinafter referred to as "basic dye") and a dye having a large molar absorption coefficient but a narrow absorption wavelength region, for example, Dye A, etc. (this dye will be hereinafter referred to as "auxiliary dye"), the photoelectric conversion efficiency is enhanced.

Figure 3A:
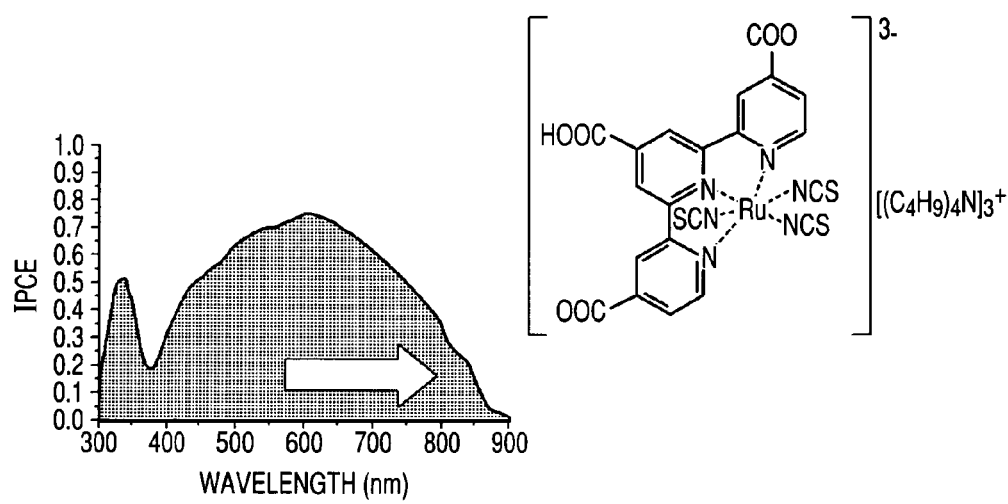
FIG. 3 illustrates an explanatory drawing showing a structural formula and an IPCE spectrum of Black Dye dye as a basic dye and Dye A as an auxiliary dye according to Embodiment 1 of the present invention.
Figure 3B:
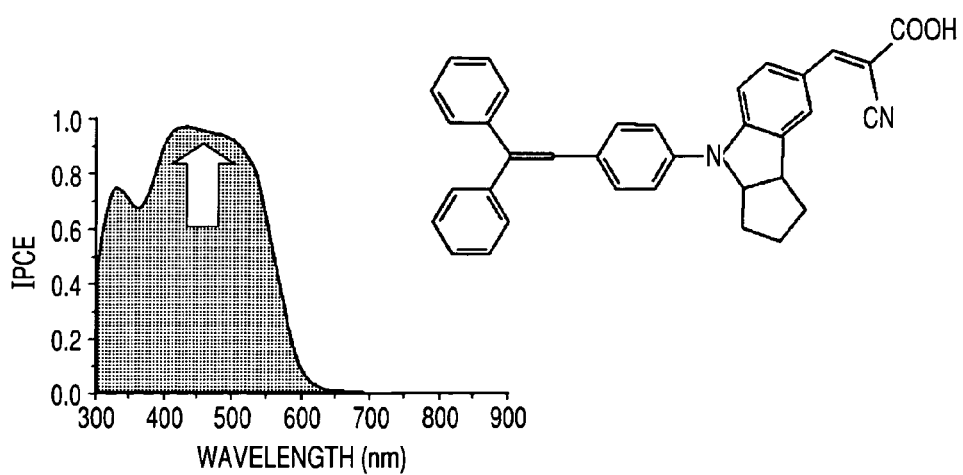
Figure 12A:
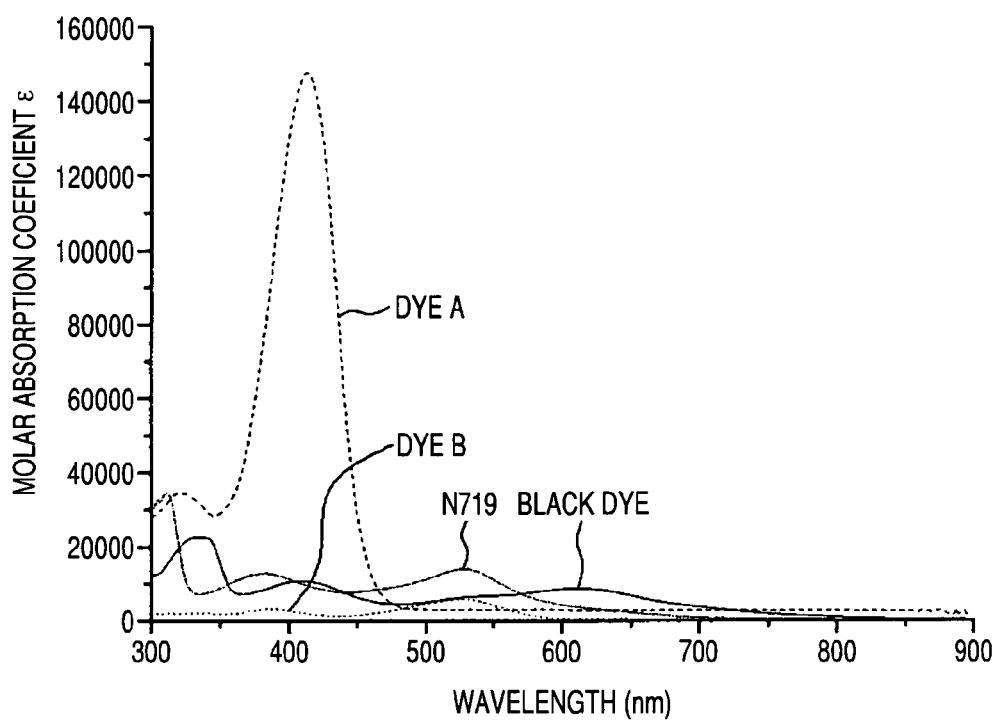
FIG. 12 illustrates absorption spectra of four kinds of representative dyes which are generally available at present in a wavelength region of from 300 to 900 nm.
Figure 12B:
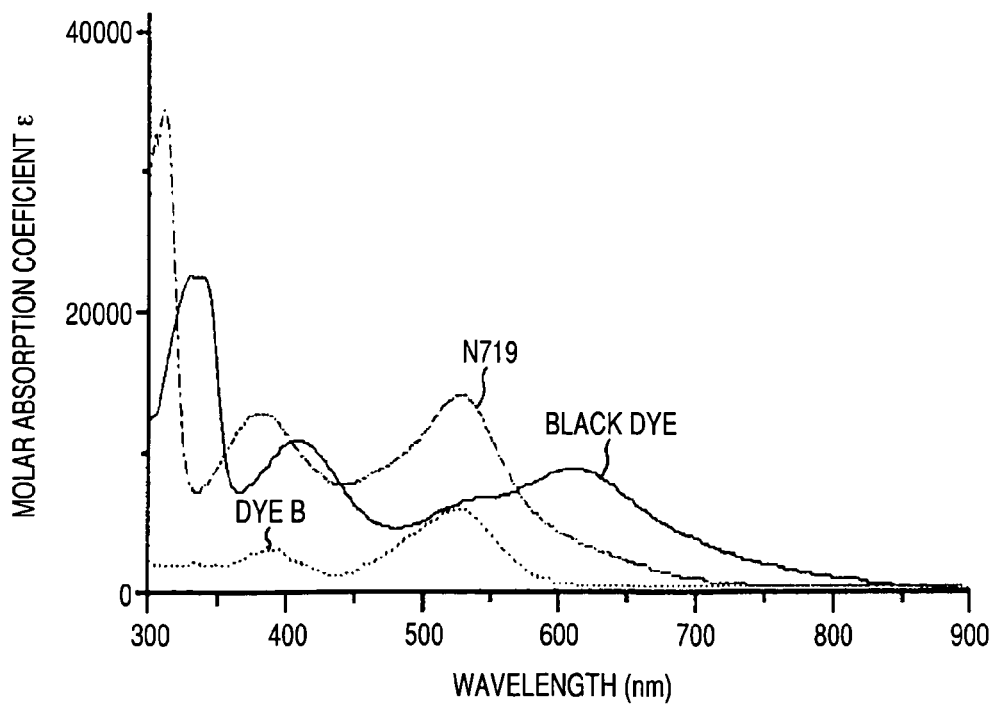

FIG. 3 is an explanatory drawing showing a structural formula and an IPCE (incident photon-to-current conversion efficiency) spectrum of each of dyes regarding a combination of Black Dye and Dye A in which the highest performance enhancing effect is obtained. It is noted from FIG. 12 as shown previously as well as FIG. 3 that there is a relation that Dye A as an auxiliary dye supports the light absorption in a short-wavelength region where the absorbance of Black Dye as a basic dye is insufficient. Moreover, an absorption peak wavelength of Black Dye is present in a wavelength region of 400 nm or more, and its long-wavelength side end of the absorption wavelength region is present in the vicinity of 860 nm, whereas an absorption peak wavelength of Dye A is present in a wavelength region of not more than 400 nm, and its long-wavelength side end of the absorption wavelength region is present in the vicinity of 480 nm. This demonstrates that the both dyes are largely different in band gap energy. It is considered that the reason why in the case where Black Dye and Dye A are intermingled on the semiconductor layer 3, different from an example which has hitherto been known, the photoelectric conversion efficiency is not lowered resides in the matter that since the both dyes are largely different in band gap energy, electron transfer between the dyes is hardly caused.

The energy diagram of FIG. 2 illustrates a mechanism in which in a system where the photosensitizing dye is composed of Black Dye and Dye A, the photoelectric conversion efficiency of Dye A is enhanced. As described previously, when the respective dyes absorb each photon, an electron in the dye is excited from a ground state (HOMO) to an excited state (LUMO). In this system, there are two kinds of routes where the electron in an excited state of Dye A is drawn out into a conduction band of the semiconductor layer 3. That is, there are a direct route 11 where the electron in an excited state of Dye A is directly drawn out into a conduction band of the semiconductor layer 3; and an indirect route 12 where the electron in an excited state of Dye A is first drawn out into an excited state of Black Dye with a low energy level and subsequently drawn out into a conduction band of the semiconductor layer 3 from the excited state of Black Dye. In the system where Black Dye coexists, the photoelectric conversion efficiency of Dye A is enhanced due to a contribution of this indirect route 12.

Figure 4:
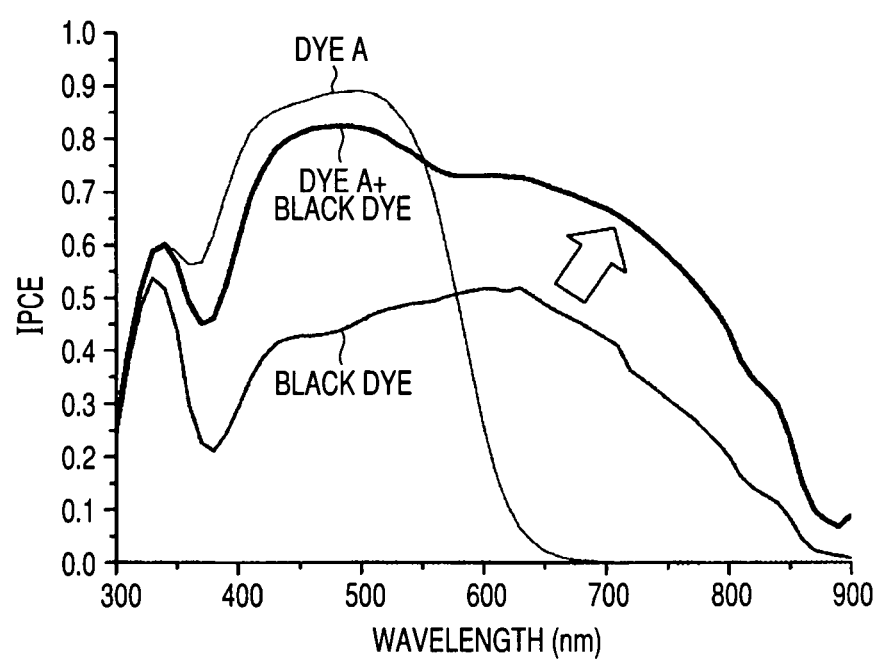
FIG. 4 is a graph illustrating an IPCE spectrum of a photoelectric converter using Black Dye as a basic dye and Dye A as an auxiliary dye according to Embodiment 1 of the present invention.

FIG. 4 is a graph illustrating an IPCE spectrum of the dye sensitization photoelectric converter 10 using Black Dye as a basic dye and Dye A as an auxiliary dye. In FIG. 4, an IPCE spectrum in the case of using each of the dyes singly was also added. As described previously, though Black Dye as a basic dye is able to absorb light of a wide-ranging wavelength, there is a region where the absorbance is insufficient in a short-wavelength region. In this short-wavelength region, there is a relation that auxiliary Dye A having a large absorbance in this region supports the light absorption. That is, Dye A works as a photosensitizing dye having a large absorbance in the short-wavelength region.

However, as described later in the Examples with reference to FIG. 9, in a system where Black Dye and Dye A coexist, the photoelectric conversion efficiency is enhanced even in a long-wavelength region where Dye A does not absorb light.

There is no other way but to understand that this is caused due to the matter that the photoelectric conversion efficiency is enhanced in the long-wavelength region of Black Dye due to the presence of Dye A. Usually, such an effect for enhancing the photoelectric conversion efficiency is realized to be an association controlling effect, namely an effect to be brought due to the matter that the association controlling agent lies between the photosensitizing dyes, controls the association of the photosensitizing dyes each other and prevents useless electron transfer between the photosensitizing dyes, whereby the excited electron is efficiently taken out into the semiconductor layer 3 from the photosensitizing dye having light absorbed therein without causing useless transfer between the dyes. That is, Dye A works as a high-performance association controlling agent in the long-wavelength region where Dye A per se does not absorb light.

On the way of elucidating this reason, the present inventors have found that since Dye A has a structure in which a carboxyl group and a cyano group are bound to the same carbon, Dye A is able to work as a high-performance association controlling agent. That is, Dye A is coupled with the semiconductor layer 3 by the carboxyl group and the cyano group present on the same carbon and takes a steric configuration different from Black Dye to be adsorbed by only the carboxyl group, whereby it is adsorbed on the semiconductor layer 3. For that reason, even when Dye A and Black Dye are adjacent to each other on the surface of the semiconductor layer 3, they can coexist without exerting a strong mutual action and do not hinder the mutual photoelectric conversion performance. On the other hand, Dye A effectively lies between the Black Dyes held on the same surface of the semiconductor layer 3 and controls the association of the Black Dyes, thereby preventing useless electron transfer between the Black Dyes. For that reason, the excited electron does not uselessly transfer between the Black Dyes from the Black Dye having light absorbed therein and is effectively taken out into the semiconductor layer 3, whereby the photoelectric conversion efficiency of the Black Dye is enhanced.

On that occasion, it is effective and desirable that the plural functional groups which Dye A has on the same carbon are composed of a carboxyl group which is strongly bound to the semiconductor layer 3 and a cyano group which is weakly bound to the semiconductor layer 3. If the plural functional groups which Dye A has on the same carbon are all a functional group which is strongly bound to the semiconductor layer 3, the steric configuration of this dye adsorbed on the semiconductor layer 3 is low in degree of freedom so that the effect that the plural functional groups are present on the same carbon is hardly exhibited. On the other hand, in Dye A, the cyano group which is weakly bound to the semiconductor layer 3 auxiliarily functions and does not disturb binding of the carboxyl group to be strongly bound to the semiconductor layer 3. As a result, the effect that the plural functional groups are present on the same carbon is effectively exhibited. Also, since the excited electron of Dye A having light absorbed therein is taken out to the semiconductor layer 3 from the carboxyl group to be strongly bound, the charge transfer to the semiconductor layer 3 is effectively performed.

Figure 5A:
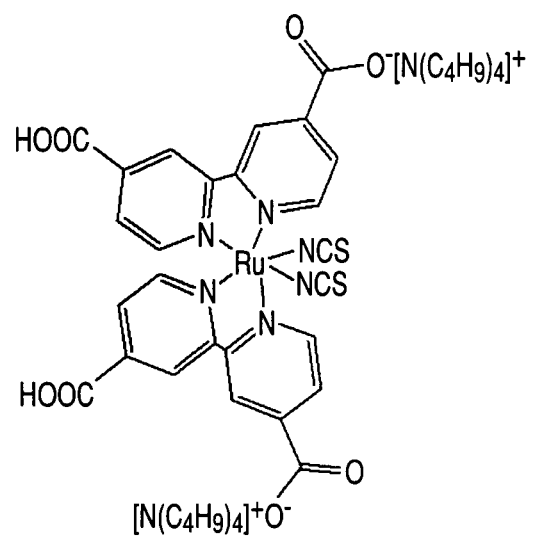
FIG. 5 illustrates structural formulae showing a structure of N719 and Dye B according to Embodiment 1 of the present invention.
Figure 5B:
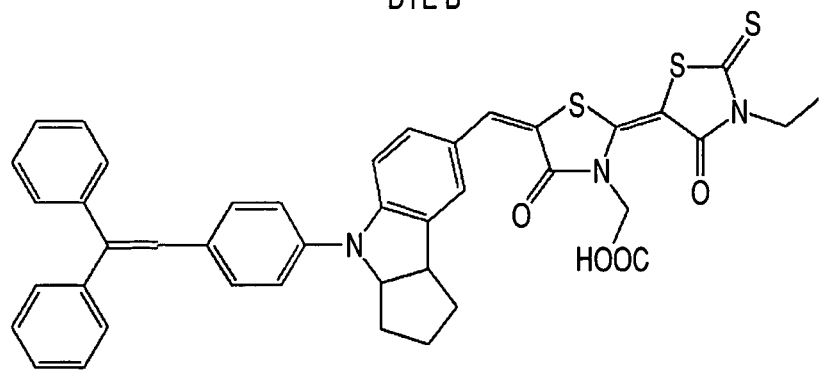

FIG. 5 illustrates structural formulae showing structures of N719 and Dye B. It is noted from FIG. 12 that similar to Black Dye, each of N719 and Dye B as a basic dye includes a short-wavelength region which the absorbance is insufficient and that there is a relation that Dye A as an auxiliary dye supports the light absorption in this region. Also, the matter that an absorption peak wavelength of each of N719 and Dye B exists in a wavelength region of 400 nm or more and that a long-wavelength side end of the absorption wavelength region is present in the vicinity of 750 nm demonstrates that the both dyes are largely different in band gap energy from Dye A. As a result, it is considered that the electron transfer to Dye A is hardly caused and that even when the both dyes are intermingled on the semiconductor 3, the photoelectric conversion efficiency is not lowered.

Examples of the basic dye having a small molar absorption coefficient (for example, not more than 100,000) but a wide absorption wavelength region include xanthene based dyes such as rose bengal and erythrosine; cyanine based dyes such as merocyanine, quinocyanine and cryptocyanine; basic dyes such as phenosafranine, cabri blue, thiosine and methylene blue; and besides, azo dyes, phthalocyanine based compounds, coumarin based compounds, bipyridine complex compounds, terpyridine complex compounds, biquinoline complex compounds, anthraquinone based dyes and polycyclic quinone based dyes. Above all, complexes containing, as a central metal ion, an ion of a metal element selected from the group consisting of ruthenium Ru, osmium Os, iridium Ir, platinum Pt, cobalt Co, iron Fe and copper Cu and, as a ligand, a pyridine ring or an imidazolium ring have a high quantum yield and are preferable as the photosensitizing dye. In particular, it is preferable to use N719 or Black Dye.

Examples of the auxiliary dye having a large molar absorption coefficient (for example, 100,000 or more) but a narrow absorption wavelength region include eosin Y, porphyrin derivatives such as chlorophyll, zinc porphyrin and magnesium porphyrin, and rhodamine B. In particular, Dye A is preferable.

However, it should not be construed that the photosensitizing dye is limited thereto, and any dye falling within the range of the molar absorption coefficient may be used. Also, it should not be construed that this system is limited to the two kinds of dyes, and two or more kinds of dyes may be mixed irrespective of the molar absorption coefficient.

A method for holding the photosensitizing dye on the semiconductor layer 3 is not particularly limited. It is desirable that the photosensitizing dye is dissolved in an appropriate solvent, for example, alcohols, nitriles, nitromethane, halogenated hydrocarbons, ethers, dimethyl sulfoxide, amides, N-methylpyrrolidone, 1,3-dimethylimidazolidinone, 3-methyloxazolidinone, esters, carbonic acid esters, ketones, hydrocarbons, water, etc., and the semiconductor layer 3 is dipped in this dye solution, or the dye solution is coated on the semiconductor layer 3, thereby adsorbing the photosensitizing dye on the semiconductor layer 3. Also, for the purpose of reducing the association of the dyes each other, deoxycholic acid, etc. may be added in the dye solution.

In order to remove the excessively adsorbed dye, after adsorbing the dye, the surface of the semiconductor layer 3 may be treated with an amine. Examples of the amine include pyridine, 4-tert-butylpyridine and polyvinylpyridine. When the amine is a liquid, such may be used as it is or may be dissolved in an organic solvent and then used.

As to other members than the photosensitizing dye 4, the same as in the existing dye sensitization photoelectric converter 100, etc. is applicable, and details thereof are described below.

A transparent substrate 1 is not particularly limited so far as it has quality and shape such that light is easy to transmit therethrough, and various substrate materials can be used. In particular, a substrate material having a high transmittance to visible light is preferable. Also, a material having a high blocking performance for retarding water or a gas which likely comes into a photoelectric conversion device from the outside and having excellent solvent resistance and weather resistance is preferable. Specific examples thereof include transparent inorganic substrates such as quartz and glass; and transparent plastic substrates such as polyethylene terephthalate, polyethylene naphthalate, polycarbonate, polystyrene, polyethylene, polypropylene, polyphenylene sulfide, polyvinylidene fluoride, acetyl cellulose, brominated phenoxy, aramids, polyimides, polystyrenes, polyallylates, polysulfones and polyolefins. The thickness of the transparent substrate 1 is not particularly limited and can be properly chosen while taking into consideration the light transmittance and a performance for blocking the inside and outside of the photoelectric conversion device.

A transparent electrode (transparent conductive layer) 2 is formed as an electron takeout electrode (negative electrode) on the surface of this transparent substrate 1. It is preferable that the transparent conductive layer 2 has low resistance as far as possible, and specifically, the resistance is preferably not more than 500 $\Omega/cm^2$, and more preferably not more than 100 $\Omega/cm^2$. As a material for forming the transparent conductive layer 2, known materials can be used. Specific examples thereof include indium-tin composite oxide (ITO), fluorine-doped tin(IV) oxide $SnO_2$ (FTO), tin(IV) oxide $SnO_2$, zinc(II) oxide ZnO and indium-zinc composite oxide (IZO). Also, the material for forming the transparent conductive layer 2 is not limited to these materials, and a combination of two or more kinds thereof can be used. The transparent conductive layer 2 is formed by a sputtering method or the like.

Also, for the purposes of reducing the resistance of an electron takeout route and enhancing the current collecting efficiency, it is possible to pattern and form a metallic wiring with high conductivity. Though a material of the metallic wiring is not particularly limited, it is desirable that it is high in corrosion resistance and oxidation resistance and low in leak current of the metal material per se. Also, even a material with low corrosion resistance can be used by separately providing a protective layer. Also, for the purpose of reducing a dark current from the substrate, it is possible to provide this metallic wiring with a barrier layer of an oxide thin film of every kind.

As the semiconductor layer 3, a porous layer obtained by sintering a semiconductor fine particle is frequently used. As the semiconductor material, in addition to single semiconductor materials represented by silicon, compound semiconductor materials or materials having a perovskite structure or the like can be used. These semiconductor materials are preferably an n-type semiconductor material in which a conduction band electron becomes a carrier under light excitation to generate an anode current. Specifically, titanium oxide $TiO_2$, zinc oxide ZnO, tungsten oxide $WO_3$, niobium oxide $Nb_2O_5$, strontium titanate $SrTiO_3$ and tin oxide $SnO_2$ are exemplified, and titanium oxide $TiO_2$ of an anatase type is especially preferable. Also, the semiconductor material is not limited thereto with respect to the kind and can be used singly or in a mixture or composite of two or more kinds thereof. Also, the semiconductor fine particle can take various forms such as a granule, a tube and a rod depending upon the need.

The fabrication method of the semiconductor layer 3 is not particularly limited. Taking into consideration physical properties, convenience, manufacturing costs and the like, a fabrication method of a wet type is preferable, and a method in which a powder or sol of a semiconductor fine particle is uniformly dispersed in a solvent such as water to prepare a dispersion in a pastes form, which is then coated or printed on the transparent substrate 1 having the transparent conductive layer 2 formed thereon is preferable. The coating method or printing method is not particularly limited but can be carried out according to a known method. For example, a dip method, a spray method, a wire bar method, a spin coating method, a roller coating method, a blade coating method and a gravure coating method, etc. can be employed as the coating method; and a letterpress printing method, an offset printing method, a gravure printing method, an intaglio printing method, a rubber stamp printing method and a screen printing method, etc. can be employed as the wet type printing method.

The crystal form of titanium oxide is preferably an anatase type which is excellent in photocatalytic activity. As the anatase type titanium oxide, a commercially available product in a powered, sol or slurry form may be used, or a titanium oxide alkoxide may be formed so as to have a desired particle size by a known method such as hydrolysis. In using a commercially available powder, it is preferable to dissipate secondary coagulation of particles; and at the time of preparing a pasty dispersion, it is preferable to pulverize particles using a mortar, a ball mill, etc. At that time, in order to prevent re-coagulation of the particles from which the secondary coagulation has been dissipated from occurring, acetylacetone, hydrochloric acid, nitric acid, a surfactant, a chelating agent and the like can be added in the pasty dispersion. Also, in order to increase the viscosity of the pasty dispersion, various thickeners such as polymers, for example, polyethylene oxide and polyvinyl alcohol or cellulose based thickeners can be added in the pasty dispersion.

Though the particle size of the semiconductor fine particle is not particularly limited, it is preferably from 1 to 200 nm, and especially preferably from 5 to 100 nm in terms of an average particle size of primary particles. Also, it is possible to mix a particle having a size larger than the semiconductor fine particle, thereby scattering the incident light and enhancing the quantum yield. In that case, an average size of the particle to be separately mixed is preferably from 20 to 500 nm.

For the purpose of enabling the semiconductor layer 3 to adsorb a large amount of the photosensitizing dye 4, the semiconductor layer 3 is preferably one having a large actual surface area including the surface of the fine particle facing on voids in the interior of the porous layer. For that reason, the actual surface area in a state that the semiconductor layer 3 is formed on the transparent electrode 2 is preferably at least 10 times, and more preferably at least 100 times the area (projected area) of the outer surface of the semiconductor layer 3. Though there is no upper limit in this ratio, it is usually about 1,000 times.

In general, as the thickness of the semiconductor layer 3 increases and the number of semiconductor fine particles to be contained per unit projected area increases, the actual surface area increases, and the amount of the dye which can be held per unit projected area increases. Therefore, the light absorptance becomes high. On the other hand, when the thickness of the semiconductor layer 3 increases, a diffusion distance until arrival of the electron which has been transferred to the semiconductor layer 3 from the photosensitizing dye 4 at the transparent electrode 2 increases. Therefore, a loss of the electron to be caused due to charge recombination within the semiconductor layer 3 becomes large. Accordingly, there is a preferable thickness in the semiconductor layer 3. It is in general from 0.1 to 100 µm, more preferably from 1 to 50 µm, and especially preferably from 3 to 30 µm.

For the purposes of coating or printing the semiconductor fine particles on the transparent electrode 2 and then electrically connecting the fine particles to each other, thereby enhancing the mechanical strength of the semiconductor layer 3 and enhancing the adhesion to the transparent electrode 2, it is preferable to bake the semiconductor layer 3. Though the range of the baking temperature is not particularly limited, when the temperature is excessively increased, there is a possibility that the electrical resistance of the transparent electrode 2 increases and that furthermore, the transparent electrode 2 is melted. Therefore, in general, the baking temperature is preferably from 40° C. to 700° C., and more preferably from 40° C. to 650° C. Also, though the baking time is not particularly limited, it is in general from about 10 minutes to 10 hours.

After the baking, for the purposes of increasing the surface area of the semiconductor fine particle and enhancing necking between the semiconductor fine particles, for example, a dip treatment with a titanium tetrachloride aqueous solution or a titanium oxide ultra-fine particle sol having a diameter of not more than 10 nm may be carried out. In the case where a plastic substrate is used as the transparent substrate 1 for supporting the transparent electrode (transparent conductive layer)$_2$, it is possible to achieve fabrication of the semiconductor layer 3 on the transparent conductive layer 2 using a binder-containing pasty dispersion and press bond it onto the transparent conductive layer 2 by a heat press.

An electrolytic liquid or an electrolyte in a gel form or solid form can be used as the electrolyte layer 5. As the electrolytic liquid, a solution containing an oxidation-reduction system (redox pair) is exemplified. Specifically, a combination of iodine $I_2$ and an iodide salt of a metal or an organic material or a combination of bromine $Br_2$ and a bromide salt of a metal or an organic material is used. As the cation constituting the metal salt include lithium $Li^+$, sodium $Na^+$, potassium $K^+$, cesium $Cs^+$, magnesium $Mg^{2+}$, calcium $Ca^{2+}$ and the like are exemplified; and as the cation constituting the organic material salt, quaternary ammonium ions such as tetraalkylammonium ions, pyridinium ions and imidazolium ions are favorable. But, it should not be construed that the present invention is limited thereto. These materials can be used singly or in admixture of two or more kinds thereof.

Besides, metal complexes such as a combination of a ferrocyanic acid salt and a ferricyanic acid salt and a combination of ferrocene and a ferricinium ion; sulfur compounds such as polysodium sulfide and a combination of an alkylthiol and an alkyl disulfide; viologen dyes; a combination of hydroquinone and quinone; and the like can be used as the electrolyte.

Of the foregoing, an electrolyte made of a combination of iodine $I_2$ and lithium iodide LiI, sodium iodide NaI or a quaternary ammonium compound such as imidazolium iodide is especially favorable. The concentration of the electrolyte salt is preferably from 0.05 M to 10 M, and more preferably from 0.2 M to 3 M relative to the solvent. The concentration of iodine $I_2$ or bromine $Br_2$ is preferably from 0.0005 M to 1 M, and more preferably from 0.001 to 0.5 M. Also, for the purpose of enhancing the open-circuit voltage or short-circuit current, various additives such as 4-tert-butylpyridine and benzimidazoliums can be added.

Examples of the solvent constituting the electrolytic liquid include water, alcohols, ethers, esters, carbonic acid esters, lactones, carboxylic acid esters, phosphoric triesters, heterocyclic compounds, nitrites, ketones, amides, nitromethane, halogenated hydrocarbons, dimethyl sulfoxide, sulforane, N-methylpyrrolidone, 1,3-dimethylimidazolidinone, 3-methyloxazolidinone and hydrocarbons. However, it should not be construed that the present invention is limited thereto. These solvents can be used singly or in admixture of two or more kinds thereof. Also, it is possible to use a room-temperature ionic liquid of a tetraalkyl based, pyridinium based or imidazolium based quaternary ammonium salt as the solvent.

For the purpose of reducing liquid leakage of the electrolytic liquid from the dye sensitization photoelectric converter 10 or volatilization of the solvent constituting the electrolytic liquid, a mixture obtained by dissolving or dispersing a gelling agent, a polymer, a crosslinking monomer, etc. in the electrolyte constituent can also be used as an electrolyte in a gel form. As to the ratio of the gelled material and the electrolyte constituent, when the amount of the electrolyte constituent is large, though the ionic conductivity becomes high, the mechanical strength is lowered. Conversely, when the amount of the electrolyte constituent is too small, though the mechanical strength is large, the ionic conductivity is lowered. For that reason, the amount of the electrolyte constituent is preferably from 50 wt % to 99 wt %, and more preferably from 80 wt % to 97 wt % of the electrolyte in a gel form. Also, it is possible to realize an all-solid-state photosensitization photoelectric converter by mixing an electrolyte and a plasticizer with a polymer and then volatilizing for removal the plasticizer.

As a material of the counter electrode 6, an arbitrary material can be used so far as it is a conductive substance. When a conductive layer is formed on the side of an insulating material facing on the electrolyte layer 5, it can be used, too. However, it is preferable to use an electrochemically stable material as the material of the counter electrode 6. Specifically, it is desirable to use platinum, gold, carbon, a conductive polymer, etc.

Also, in order to enhance the catalytic action to the reduction reaction in the counter electrode 6, it is preferable to form the counter electrode 6 in such a manner that a micro structure is formed on the surface of the counter electrode 6 coming into contact with the electrolyte layer 5, thereby increasing the actual surface area. For example, when platinum is concerned, it is preferable that the counter electrode 6 is formed in a state of platinum black; and when carbon is concerned, it is preferable that the counter electrode 6 is formed in a state of porous carbon. The platinum black can be formed by an anodic oxidation method of platinum, a chloroplatinic acid treatment, etc.; and the porous carbon can be formed by sintering of a carbon fine particle, baking of an organic polymer or other method.

Since the counter substrate 7 is not required to pass light therethrough, opaque glass plates, plastic plates, ceramic plates and metal plates may be used as a material. Also, the counter substrate 7 can be used as a transparent counter substrate by forming a transparent conductive layer on a transparent counter electrode and forming a wiring by a metal such as platinum having a high oxidation-reduction catalytic action thereon or treating the surface with chloroplatinic acid.

A manufacturing method of the dye sensitization photoelectric converter 10 is not particularly limited. In the case where the electrolyte is a liquid, or in the case where a liquid electrolyte is introduced to gelatinize it in the interior of the dye sensitization photoelectric converter 10, a method for injecting an electrolytic liquid into the dye sensitization photoelectric converter 10, the surroundings of which are sealed in advance and which is provided with an injection port, is preferable.

In order to seal the dye sensitization photoelectric converter 10, the semiconductor layer 3 and the counter electrode 6 are faced on each other while providing an appropriate gap such that they do not come into contact with each other, and the substrate 1 and the counter substrate 7 are stuck in a region where the semiconductor layer 3 is not formed. Though the size of the gap between the semiconductor layer 3 and the counter electrode 6 is not particularly limited, it is in general from 1 to 100 µm, and more preferably from 1 to 50 µm. When a distance of this gap is too large, the conductivity is lowered, and the photocurrent is reduced.

Though a material of the sealing medium is not particularly limited, materials provided with lightfastness, insulating properties or waterproof properties are preferable. Various welding methods and epoxy resins, ultraviolet ray-curable resins, acrylic resins, polyisobutylene resins, EVA (ethylene vinyl acetate), ionomer resins, ceramics, various thermal adhesiveness resins and the like can be used. Also, a place at which the injection port is provided is not particularly limited so far as it is not located above the semiconductor layer 3 and the counter electrode 6 facing thereon.

Though a method for injecting the electrolytic liquid is not particularly limited, a method of pouring a few drops of the solution on the injection port and introducing them by means of a capillary phenomenon is simple. Also, the injection operation can be carried out under a reduced pressure or upon heating as the need arises. After the solution has been completely injected, the solution remaining in the injection port is removed, and the injection port is sealed. Though this sealing method is not particularly limited, too, sealing can be achieved by sticking a glass plate or a plastic substrate with a sealing medium, if desired.

Also, in the case where the electrolyte is an electrolyte to be gelled using a polymer, etc. or an all-solid-state electrolyte, a polymer solution containing the electrolyte and a plasticizer is coated on the semiconductor layer 3 by a casting method or other method. Thereafter, the plasticizer is volatilized and completely removed, and sealing is then performed with a sealing medium in the same manner as described above. It is preferable that this sealing is carried out under an inert gas atmosphere or under a reduced pressure using a vacuum sealer or the like. After performing the sealing, it is also possible to perform operations of heating and applying a pressure depending upon the need such that the electrolytic liquid of the electrolyte layer 5 thoroughly penetrates into the semiconductor layer 3.

The dye sensitization photoelectric converter on the basis of Embodiment 1 of the present invention can be prepared in a shape of every kind depending upon its application, and its shape is not particularly limited.

Embodiment 2

Figure 6:
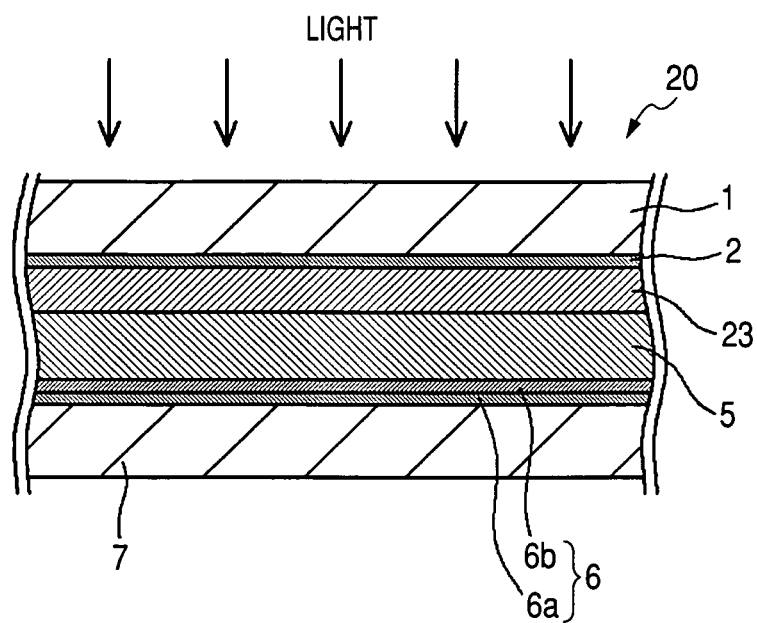
FIG. 6 is a cross-sectional view of the principal part illustrating a structure of a dye sensitization photoelectric converter according to Embodiment 2 of the present invention.

FIG. 6 is a cross-sectional view of the principal part illustrating a structure of a dye sensitization photoelectric converter 20 on the basis of Embodiment 2, which is chiefly corresponding to the second dye sensitization photoelectric converter set forth in claim 14. The dye sensitization photoelectric converter 20 is chiefly configured of a transparent substrate 1 such as glass, a transparent electrode (negative electrode) 2 composed of a transparent conductive layer such as FTO (fluorine-doped tin(IV) oxide $SnO_2$), a semiconductor layer 23 holding a photosensitizing dye and an association controlling agent, an electrolyte layer 5, a counter electrode (positive electrode) 6, a counter substrate 7 and a non-illustrated sealing medium, etc.

Similar to the semiconductor layer 3 of the dye sensitization photoelectric converter 10, it is desirable to use a porous layer obtained by sintering a fine particle of titanium oxide $TiO_2$ as the semiconductor layer 23. A photosensitizing dye and an association controlling agent are held on the surface of the fine particle configuring this semiconductor layer 23. The electrolyte layer 5 is filled between the semiconductor layer 3 and the counter electrode 6, and an organic electrolytic liquid containing an oxidation-reduction species (redox pair) such as $I^-/I_3^-$ or the like is used. The counter electrode 6 is configured of a platinum layer 6b, etc. and formed on the counter substrate 7.

The dye sensitization photoelectric converter 20 does not differ from the existing dye sensitization photoelectric convertor 100, except that the association controlling agent has plural functional groups bound to the semiconductor layer 23 on the same carbon as a characteristic of this embodiment and is an association controlling molecule capable of enhancing photoelectric conversion efficiency of a photosensitizing dye by controlling the association of the photosensitizing dye. This association controlling molecule may be a single kind of a photosensitizing dye per se, or different from that, it may be a molecule not having a photoelectric conversion function.

It is desirable that the functional groups which the association controlling molecule has are composed of a functional group which is strongly bound to the semiconductor layer 23 and a functional group which is weakly bound to the semiconductor layer 23. If the foregoing plural functional groups which the association controlling molecule has on the same carbon are all a functional group which is strongly bound to the semiconductor layer 23, the steric configuration which the association controlling molecule adsorbed on the semiconductor layer 23 takes is low in degree of freedom so that the effect that the plural functional groups are present is hardly exhibited. On the other hand, since the plural functional groups which the association controlling molecule has are composed of a functional group to be strongly bound to the semiconductor layer 23 and a functional group to be weakly bound, the functional group to be weakly bound auxiliarily functions and does not disturb binding of the functional group to be strongly bound to the semiconductor layer 23. As a result, the effect that the plural functional groups are present on the same carbon is effectively exhibited. For example, it is desirable that the functional group which is strongly bound to the semiconductor layer 23 is a carboxyl group —COOH or a phosphono group —PO(OH)$_2$, whereas the functional group which is weakly bound to the semiconductor layer 23 is a cyano group —CN, an amino group —NH$_2$, a thiol group —SH or a thione group —CS—.

The photosensitizing dye is not particularly limited so far as it exhibits a sensitizing action. However, in order that the photosensitizing dye may be adsorbed on the semiconductor layer 23, an acid functional group is necessary, a dye having a carboxyl group —COOH or a phosphono group —PO(OH)$_2$ is preferable, and a dye having a carboxyl group is especially preferable.

Examples of the photosensitizing dye include xanthene based dyes such as rhodamine B, rose bengal, eosin and erythrosine; cyanine based dyes such as merocyanine quinocyanine and cryptocyanine; basic dyes such as phenosafranine, cabri blue, thiosine and methylene blue; porphyrin compounds such as chlorophyll, zinc porphyrin and magnesium porphyrin; and besides, azo dyes, phthalocyanine compounds, coumarin based compounds, bipyridine complex compounds, anthraquinone based dyes and polycyclic quinone based dyes. Above all, metal complexes containing, as a ligand, a pyridine ring or an imidazolium ring and, as a central metal ion, an ion of a metal element selected from the group consisting of ruthenium Ru, osmium Os, iridium Ir, platinum Pt, cobalt Co, iron Fe and copper Cu have a high quantum yield and are preferable as the photosensitizing dye. In particular, N719 or Black Dye has a wide absorption wavelength region and is preferable. However, the photosensitive dye is not limited thereto and can be used singly or in admixture of two or more kinds thereof.

A method for holding the photosensitizing dye and the association controlling agent on the semiconductor layer 23 is not particularly limited. It is desirable that the photosensitizing dye and the association controlling agent are dissolved in an appropriate solvent, for example, alcohols, nitriles, nitromethane, halogenated hydrocarbons, ethers, dimethyl sulfoxide, amides, N-methylpyrrolidone, 1,3-dimethylimidazolidinone, 3-methyloxazolidinone, esters, carbonic acid esters, ketones, hydrocarbons, water, etc., and the semiconductor layer 23 is dipped in this dye solution, or the dye solution is coated on the semiconductor layer 23, thereby adsorbing the photosensitizing dye on the semiconductor layer 23.

Also, for the purpose of reducing the association of the photosensitizing dyes each other, a coadsorbent may be added in the photosensitizing dye solution. As the coadsorbent, for example, chenodeoxycholic acid, taurodeoxycholic acid salts 1-decrylphosphonic acid and the like can be used, and it is general to use chenodeoxycholic acid. The concentration is in general from 10 moles/L to 0.5 moles/L, and especially preferably from 0.3 μmoles/L to 0.2 moles/L.

After adsorbing the photosensitizing dye, the surface of the semiconductor layer 23 may be treated with an amine. Examples of the amine include pyridine, 4-tert-butylpyridine and polyvinylpyridine. When the amine is a liquid, such may be used as it is or may be dissolved in an organic solvent and used.

As to other members than the photosensitizing dye and the association controlling agent, the same as in the dye sensitization photoelectric converter 10 is applicable. Therefore, overlapping is avoided, and descriptions thereof are omitted The dye sensitization photoelectric converter on the basis of Embodiment 2 of the present invention can be prepared in a shape of every kind depending upon its application, and its shape is not particularly limited.

EXAMPLES

Examples of the present invention are hereunder described, but it should not be construed that the present invention is limited thereto. In the present Examples, the dye sensitization photoelectric converter 10 as illustrated in FIG. 1 or the dye sensitization photoelectric converter 20 as illustrated in FIG. 6 was prepared, measured for performances such as photoelectric conversion rate and compared with those in Comparative Examples.

Preparation of Dye Sensitization Photoelectric Converter

Example 1

A pasty dispersion of titanium oxide $TiO_2$ which is a raw material in forming the semiconductor layer 3 was prepared with reference to *Recent Advances in Research and Development for Dye-Sensitized Solar Cells* (supervised by Hironori Arakawa, 2001, CMC Publishing Co., Ltd.). That is, first of all, 125 mL of titanium isopropoxide was added dropwise step by step in 750 mL of a 0.1 M nitric acid aqueous solution with stirring at room temperature. After completion of the dropwise addition, the mixture was transferred into a thermostat oven at 80° C., and stirring was continued for 8 hours. As a result, a cloudy translucent sol solution was obtained. This sol solution was allowed to stand for cooling to room temperature and then filtered through a glass filter, and thereafter, a solvent was added to make the solution to 700 mL in volume. The obtained sol solution was transferred into an autoclave, subjected to a hydrothermal reaction at 220° C. for 12 hours and then ultrasonically treated for one hour to achieve a dispersion treatment. Subsequently, this solution was concentrated at 40° C. using an evaporator and prepared so as to have the content of $TiO_2$ of 20 wt %. To this concentrated sol solution, polyethylene glycol (molecular weight: 500,000) in an amount corresponding to 20% of the mass of $TiO_2$ and anatase type $TiO_2$ having a particle diameter of 200 nm in an amount corresponding to 30% of the mass of $TiO_2$ were added, and the mixture was uniformly mixed by a stirring deaerator to obtain a pasty dispersion of $TiO_2$ with increased viscosity.

The foregoing pasty dispersion of $TiO_2$ was coated on an FTO layer as the transparent electrode (transparent conductive layer) 2 by a blade coating method, thereby forming a fine particle layer having a size of 5 mm×5 mm and a thickness of 200 μm. Thereafter, the fine particle layer was kept at 500° C. for 30 minutes, thereby sintering a $TiO_2$ fine particle on the FTO layer. A 0.1 M titanium(IV) chloride $TiCl_4$ aqueous solution was added dropwise on the sintered $TiO_2$ film, and after keeping at room temperature for 15 hours, the $TiO_2$ film was rinsed and again baked at 500° C. for 30 minutes. Thereafter, a treatment for irradiating ultraviolet rays on the $TiO_2$ sintered body for 30 minutes using a UV (ultraviolet ray) irradiation unit to oxidatively decompose and remove impurities to be contained in the $TiO_2$ sintered body, such as organic materials due to a catalytic action of $TiO_2$ and enhance the activity of the $TiO_2$ sintered body was carried out to obtain the semiconductor layer 3.

23.8 mg of N719 and 2.5 mg of Dye A, both of which had been thoroughly purified, were dissolved as the photosensitizing dye 4 in 50 mL of a mixed solvent of a mixture of acetonitrile and tert-butanol in a volume ratio of 1/1 (hereafter abbreviated as "mixed solvent of acetonitrile and tert-butanol"), thereby preparing a photosensitizing dye solution.

Next, the semiconductor layer 3 was dipped in this photosensitizing dye solution at room temperature for 24 hours, thereby holding the photosensitizing dye on the surface of the $TiO_2$ fine particle. Next, the semiconductor layer 3 was successively rinsed with an acetonitrile solution of 4-tert-butylpyridine and acetonitrile, and thereafter, the solvent was evaporated in a dark place, followed by drying.

An electrode prepared by successively stacking a chromium layer having a thickness of 500 angstroms and a platinum layer having a thickness of 1,000 angstroms on an FTO layer in which a 0.5-mm injection port had been formed in advance by a sputtering method, spray coating an isopropyl alcohol (2-propanol) solution of chloroplatinic acid thereon and heating at 385° C. for 15 minutes was used as the counter electrode 6.

The thus-processed semiconductor layer 3 and counter electrode 6 were disposed facing on each other, and the outer periphery was sealed with a 30-μm ionomer resin film and an acrylic ultraviolet ray-curable resin.

On the other hand, 0.030 g of sodium iodide NaI, 1.0 g of 1-propyl-2,3-dimethylimidazolium iodide, 0.10 g of iodine $I_2$ and 0.054 g of 4-tert-butylpyridine (TBP) were dissolved in 2.0 g of methoxypropionitrile to prepare an electrolytic liquid.

This electrolytic liquid was injected from the previously-prepared injection port of the dye sensitization photoelectric converter 10 using a liquid delivery pump and the converter was depressurized to expel air bubbles in the interior of the converter. Subsequently, the injection port was sealed with an ionomer resin film, an acrylic resin and a glass substrate, thereby accomplishing the dye sensitization photoelectric converter 10.

Example 2

25.5 mg of Black Dye and 3.2 mg of Dye A, both of which had been thoroughly purified, were dissolved as the photosensitizing dye 4 in 50 mL of a mixed solvent of acetonitrile and tert-butanol, thereby preparing a photosensitizing dye solution. Next, the semiconductor layer 3 was dipped in this photosensitizing dye solution at room temperature for 72 hours, thereby holding the photosensitizing dye on the surface of the $TiO_2$ fine particle. Besides, the same procedures as in Example 1 were followed to prepare the dye sensitization photoelectric converter 10.

Example 3

14.8 mg of Dye B and 2.5 mg of Dye A, both of which had been thoroughly purified, were dissolved as the photosensitizing dye 4 in 50 mL of a mixed solvent of acetonitrile and tert-butanol, thereby preparing a photosensitizing dye solution. Besides, the same procedures as in Example 1 were followed to prepare the dye sensitization photoelectric converter 10.

Example 4

8.9 mg of N719, 12.8 mg of Black Dye and 1.6 mg of Dye A, all of which had been thoroughly purified, were dissolved as the photosensitizing dye 4 in 50 mL of a mixed solvent of acetonitrile and tert-butanol, thereby preparing a photosensitizing dye solution.

Next, the semiconductor layer 3 was dipped in this photosensitizing dye solution at room temperature for 48 hours, thereby holding the photosensitizing dye on the surface of the $TiO_2$ fine particle. Next, the semiconductor layer 3 was successively rinsed with an acetonitrile solution of 4-tert-butylpyridine and acetonitrile, and thereafter, the solvent was evaporated in a dark place, followed by drying. Besides, the same procedures as in Example 1 were followed to prepare the dye sensitization photoelectric converter 10.

Comparative Example 1

29 mg of N719 which had been thoroughly purified was dissolved as a photosensitizing dye in 50 mL of a mixed solvent of acetonitrile and tert-butanol, thereby preparing a photosensitizing dye solution. Besides, the same procedures as in Example 1 were followed to prepare a dye sensitization photoelectric converter similar to the dye sensitization photoelectric converter 10.

Comparative Example 2

18.5 mg of Dye B which had been thoroughly purified was dissolved as a photosensitizing dye in 50 mL of a mixed solvent of acetonitrile and tert-butanol, thereby preparing a photosensitizing dye solution. Besides, the same procedures as in Example 1 were followed to prepare a dye sensitization photoelectric converter similar to the dye sensitization photoelectric converter 10.

Example 5

13.6 mg of Black Dye which had been thoroughly purified was dissolved as a photosensitizing dye in 50 mL of a mixed solvent of acetonitrile and tert-butanol, to which was then added 1.3 mg of α-cyanocinnamic acid as an association controlling agent, thereby preparing a photosensitizing dye solution. Next, the semiconductor layer 23 obtained in the same manner as in Example 1 was dipped in this photosensitizing dye solution at room temperature for 72 hours, thereby holding the photosensitizing dye and the association controlling agent on the surface of the $TiO_2$ fine particle. Next, the semiconductor layer 23 was successively rinsed with an acetonitrile solution of 4-tert-butylpyridine and acetonitrile, and thereafter, the solvent was evaporated in a dark place, followed by drying. Besides, the same procedures as in Example 1 were followed to prepare the dye sensitization photoelectric converter 20.

Example 6

13.6 mg of Black Dye which had been thoroughly purified was dissolved as a photosensitizing dye in 50 mL of a mixed solvent of acetonitrile and tert-butanol, to which was then added 5.1 mg of phenylthiohydantoin-tryptophan as an association controlling agent, thereby preparing a photosensitizing dye solution. Besides, the same procedures as in Example 5 were followed to prepare the dye sensitization photoelectric converter 20.

Comparative Example 3

25.5 mg of Black Dye which had been thoroughly purified was dissolved as a photosensitizing dye in 50 mL of ethanol, to which was then added 392.6 mg of chenodeoxycholic acid as an association controlling agent, thereby preparing a photosensitizing dye solution. Next, the semiconductor layer 23 obtained in the same manner as in Example 1 was dipped in this photosensitizing dye solution at room temperature for 72 hours, thereby holding the photosensitizing dye and the association controlling agent on the surface of the $TiO_2$ fine particle. Next, the semiconductor layer 23 was rinsed with ethanol, and thereafter, the solvent was evaporated in a dark place, followed by drying. Besides, the same procedures as in Example 5 were followed to prepare a dye sensitization photoelectric converter similar to the dye sensitization photoelectric converter 20.

Comparative Example 4

13.6 mg of Black Dye which had been thoroughly purified was dissolved as a photosensitizing dye in 50 mL of a mixed solvent of acetonitrile and tert-butanol, thereby preparing a photosensitizing dye solution. Besides, the same procedures as in Example 5 were followed to prepare a dye sensitization photoelectric converter similar to the dye sensitization photoelectric converter 20.

<Performance Evaluation of Dye Sensitization Photoelectric Converter>

The thus prepared dye sensitization photoelectric converters of Examples 1 to 6 and Comparative Examples 1 to 4 were measured for short-circuit current, open-circuit voltage, fill factor and photoelectric conversion efficiency in a current-voltage curve at the time of irradiation of artificial sunlight (AM1.5, 100 mW/cm$^2$). Tables 1 and 2 are each a table showing the foregoing measurement results. The fill factor is also called a shape factor and is one of parameters exhibiting properties of a photoelectric converter. In the current-voltage curve of an ideal photoelectric converter, a fixed output voltage having the same size as the open-circuit voltage is kept until an output current reaches the same size as the short-circuit current. But, the current-voltage curve of an actual photoelectric converter becomes in a shape deviated from the ideal current-voltage curve because of the presence of an internal resistance. A ratio of an area of a region surrounded by the actual current-voltage curve and the x-axis and the y-axis to an area of a rectangle surrounded by the ideal current-voltage curve and the x-axis and the y-axis refers to a fill factor. The fill factor shows a degree of the deviation from the ideal current-voltage curve and is used at the time of calculating actual photoelectric conversion efficiency. Also, in the tables, Black Dye was abbreviated as "BD"; and phenylthiohydantoin-tryptophan was abbreviated as "P-tryptophan".

[Table 1]

TABLE 1

|  | Photosensitizing dye | Open-circuit voltage (V) | Short-circuit current density (mA/cm$^2$) | Fill factor (%) | Photoelectric conversion efficiency (%) |
|---|---|---|---|---|---|
| Example 1 | N719 + Dye A | 0.776 | 15.69 | 71.5 | 8.71 |
| Example 2 | BD + Dye A | 0.702 | 21.22 | 62.9 | 10.00 |
| Example 3 | Dye B + Dye A | 0.672 | 13.96 | 67.1 | 6.30 |
| Example 4 | N719 + BD + Dye A | 0.729 | 21.93 | 66.2 | 10.58 |
| Comparative Example 1 | N 719 | 0.760 | 15.02 | 71.8 | 8.19 |
| Comparative Example 2 | Dye B | 0.680 | 13.46 | 64.8 | 5.93 |

[Table 2]

TABLE 2

|  | Photosensitizing dye | Open-circuit voltage (V) | Short-circuit current density (mA/cm$^2$) | Fill factor (%) | Photoelectric conversion efficiency (%) |
|---|---|---|---|---|---|
| Example 5 | BD + α-Cyanocinnamic acid | 0.701 | 15.79 | 68.1 | 7.54 |
| Example 6 | BD + P-Tryptophan | 0.700 | 16.22 | 67.2 | 7.63 |
| Example 2 | BD + Dye A | 0.702 | 21.22 | 62.9 | 10.00 |
| Comparative Example 3 | BD + Chenodeoxycholic acid | 0.697 | 15.14 | 70.2 | 7.41 |
| Comparative Example 4 | BD | 0.735 | 13.83 | 68.4 | 6.95 |

Figure 7:
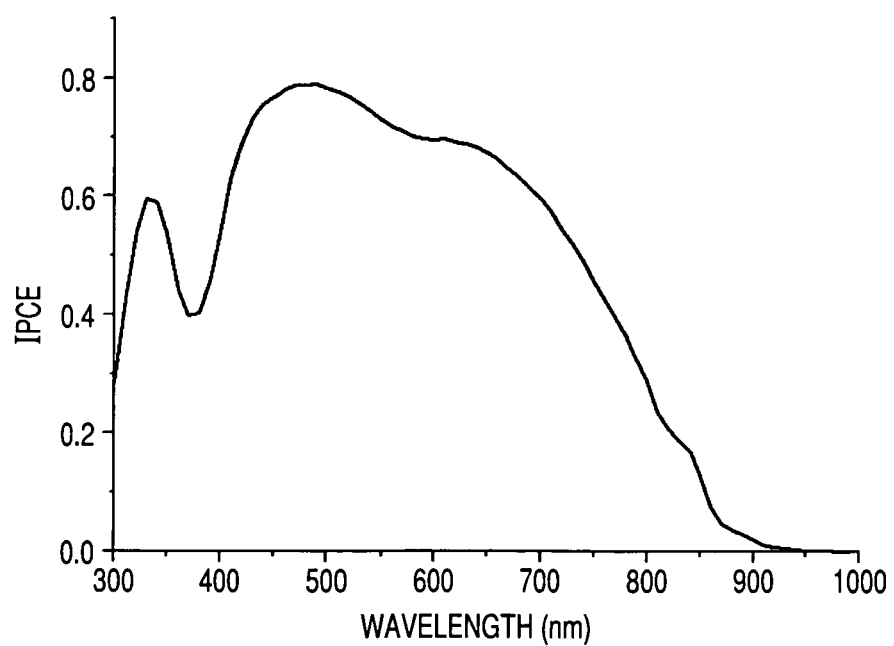
FIG. 7 is a graph illustrating an IPCE spectrum of a photoelectric converter of Example 4 using N719 and Black Dye as a basic dye and Dye A as an auxiliary dye.

As is clear from Table 1, in the combinations of N719, Black Dye or Dye B with Dye A, the photoelectric conversion efficiency was enhanced. While all of causes for this have not been elucidated yet, the principal cause is one as already described in Embodiment 1. FIG. 7 illustrates an IPCE spectrum of the photoelectric converter of Example 4 using N719 and Black Dye as a basic dye and Dye A as an auxiliary dye.

Figure 8A:
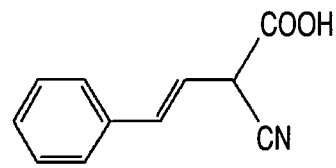
FIG. 8 illustrates structural formulae showing structures of association controlling agents (coadsorbent) used in Examples 5 and 6 of the present invention and Comparative Example 3.
Figure 8B:
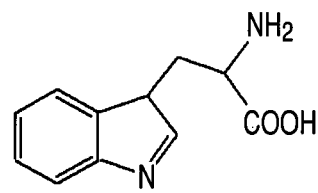
Figure 8C:
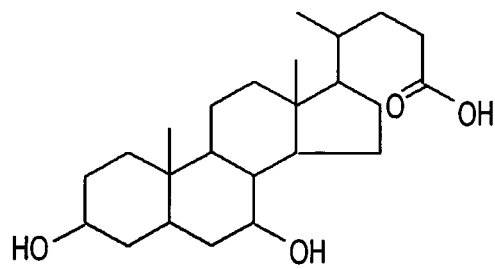

FIG. 8 illustrates structural formulae showing structure of the association controlling agent (coadsorbent) used in Examples 5 and 6 and Comparative Example 3. α-Cyanocinnamic acid and phenylthiohydantoin-tryptophan each have a carboxyl group as a functional group to be strongly bound to the semiconductor layer and a cyano group or an amino group as a functional group to be weakly bound to the semiconductor on terminal carbon. As illustrated in FIG. 3, Dye A also has a carboxyl group as a functional group to be strongly bound to the semiconductor layer and a cyano group as a functional group to be weakly bound to the semiconductor on terminal carbon. As is clear from Table 2, the photoelectric converters 20 and 10 of Examples 5, 6 and 2 in which such an association controlling agent is held together with the photosensitizing dye on the semiconductor layers 23 and 3, respectively are excellent in the short-circuit current density and photoelectric conversion efficiency as compared with Comparative Example 3 using chenodeoxycholic acid which is an association controlling agent (coadsorbent) not having such a structure and Comparative Example 4 not using an association controlling agent (coadsorbent) and demonstrate the superiority of the present invention.

Figure 9A:
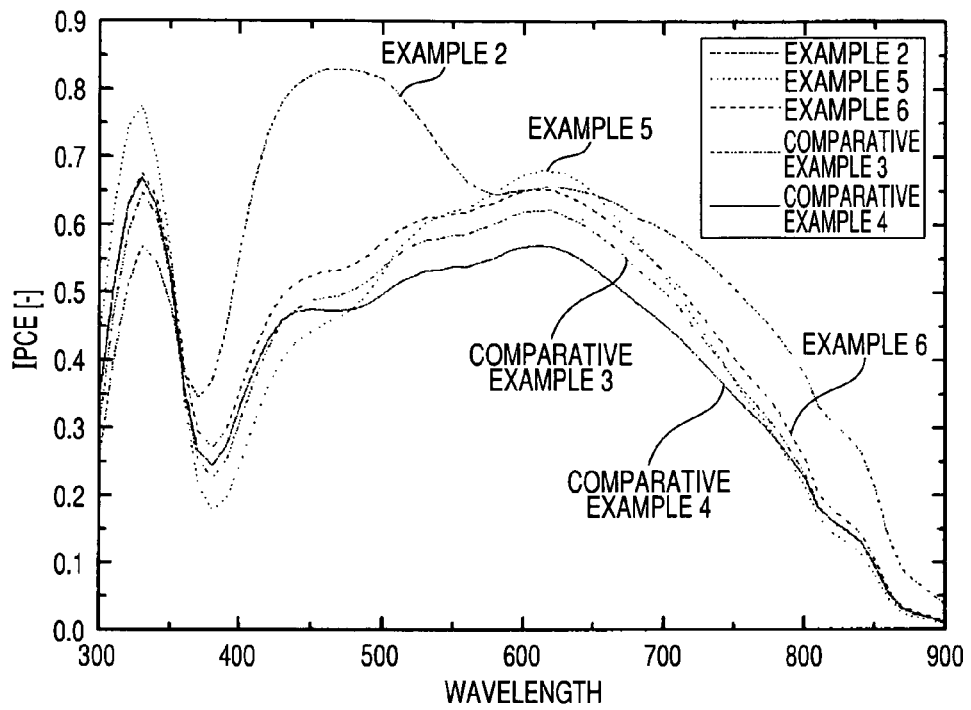
FIG. 9 illustrates IPCE spectra of photoelectric converters according to Examples 2, 5 and 6 of the present invention and Comparative Examples 3 and 4 and an enlarged drawing of a long-wavelength region thereof.
Figure 9B:
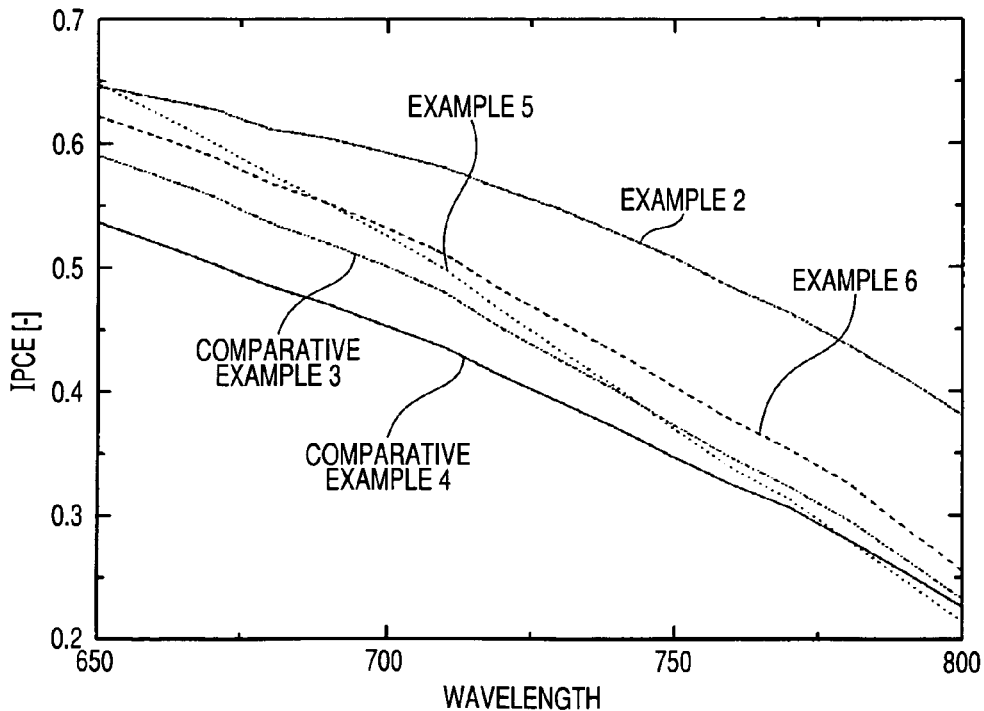
Figure 10:
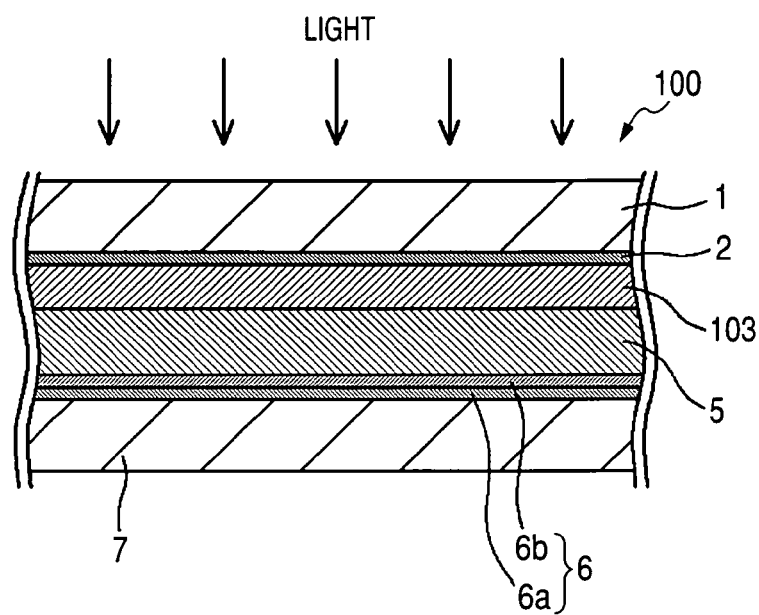
FIG. 10 is a cross-sectional view of the principal part illustrating a structure of an existing general dye sensitization photoelectric converter.
Figure 11:
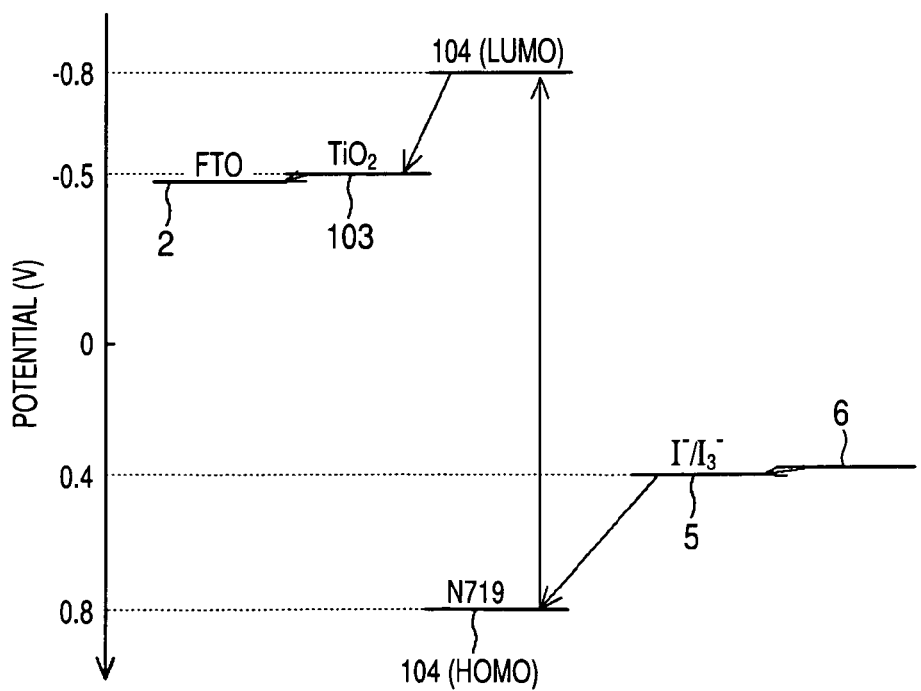
FIG. 11 is an energy diagram for explaining the actuation principle of an existing general dye sensitization photoelectric converter.

FIG. 9 illustrates (a) IPCE spectra of the photoelectric converters according to Examples 2, 5 and 6 and Comparative Examples 3 and 4 and (b) an enlarged drawing of a long-wavelength region thereof. As is clear from FIG. 9(a), since Dye A per se works a photosensitizing dye in a short-wavelength region, the IPCE spectrum of the photoelectric converter of Example 2 using Dye A is more excellent in a short-wavelength region of from 350 to 600 nm than those of other photoelectric converters. This is a cause of the excellent short-circuit current density and photoelectric conversion efficiency of Example 2 as shown in Table 2.

However, on careful review, it is noted that the IPCE spectrum of the photoelectric converter of Example 2 is more excellent even in a long-wavelength region where Dye A does not exhibit a photoelectric conversion function than those of other photoelectric converters. This is because Dye A enhances as an association controlling agent the photoelectric conversion efficiency of Black Dye as a basic dye in the long-wavelength region.

While the present invention has been described with reference to the Embodiments and Examples, it should not be construed that the present invention is limited thereto. Needless to say, changes can be appropriately made within the scope from which the gist of the invention is not deviated.

INDUSTRIAL APPLICABILITY

The dye sensitization photoelectric converter according to the present invention is applied to a solar cell, etc., realizes high performance and low costs of a solar cell and contributes to its diffusion.

The invention claimed is:
1. A dye sensitization photoelectric converter comprising:
a semiconductor layer;
multiple kinds of dyes comprising a polypyridine complex having a carboxyl group —COOH or a phosphono group —PO(OH)$_2$ and an aromatic polycyclic conju- gated molecule having an electron donating group and an electron accepting group, wherein the aromatic polycyclic conjugated molecule comprises a first functional group comprising a carboxyl group —COOH or a phosphono group —PO(OH)$_2$, and the aromatic polycyclic conjugated molecule comprises a second functional group comprising cyano group —CN, an amino group —NH$_2$, a thiol group —SH or a thione group —CS—, and wherein the first functional group and the second functional group are bound to the semiconductor layer and bound to the same carbon.

2. The dye sensitization photoelectric converter according to claim 1, wherein the minimum excitation energy of each of the multiple kinds of dyes differs from a ground state (HOMO) to an excited state (LUMO) by at least 0.172 to 0.209 eV or more.

3. The dye sensitization photoelectric converter according to claim 1, wherein the multiple kinds of dyes are composed of a first dye whose maximum absorption band is present in a wavelength region of 400 nm or more and a second dye whose maximum absorption band is present in a wavelength region of not more than 400 nm.

4. The dye sensitization photoelectric converter according to claim 1, wherein the multiple kinds of dyes are composed of a first dye having a large quantum yield in a first visible light region and a second dye having a small quantum yield in a second visible light region.

5. The dye sensitization photoelectric converter according to claim 1, wherein the multiple kinds of dyes are composed of a first dye having a large molar absorption coefficient and a second dye having a small molar absorption coefficient.

6. The dye sensitization photoelectric converter according to claim 5, wherein the molar absorption coefficient of the first dye having the large molar absorption coefficient is 100,000 or more, and the molar absorption coefficient of the second dye having the small molar absorption coefficient is not more than 100,000.

7. The dye sensitization photoelectric converter according to claim 1, further comprising a semiconductor layer, wherein the multiple kinds of dyes are held in a different steric configuration from each other in the semiconductor layer.

8. The dye sensitization photoelectric converter according to claim 7, wherein the multiple kinds of dyes are composed of an inorganic complex dye having properties for causing MLCT (metal to ligand charge transfer) and an organic molecule dye having intramolecular CT (charge transfer) properties.

9. The dye sensitization photoelectric converter according to claim 8, wherein the inorganic complex dye having properties for causing MLCT is a polypyridine complex, and the organic molecule dye having intramolecular CT properties is an aromatic polycyclic conjugated molecule in which an electron donating group and an electron accepting group are linearly disposed.

10. The dye sensitization photoelectric converter according to claim 1, further comprising a semiconductor layer, wherein at least one dye of the multiple kinds of dyes has multiple functional groups bound to the semiconductor layer on the same carbon, and the at least one dye controls association with at least one second dye of the multiple kinds of dyes of a different kind from the at least one dye, thereby enhancing the photoelectric conversion efficiency of the second dye of that different kind.

11. The dye sensitization photoelectric converter according to claim 10, wherein the multiple functional groups are composed of a first functional group which is strongly bound to the semiconductor layer and a second functional group which is weakly bound to the semiconductor layer.

12. The dye sensitization photoelectric converter according to claim 11, wherein the first functional group comprises a carboxyl group —COOH or a phosphono group —PO(OH)$_2$, and the second functional group comprises a cyano group —CN, an amino group —NH$_2$, a thiol group —SH or a thione group —CS—.

13. A dye sensitization photoelectric converter configured such that light is absorbed by a photosensitizing dye held in a semiconductor layer and that an electron of the photosensitizing dye excited by this light absorption is taken out to the outside via the semiconductor layer,
which is characterized in
that multiple kinds of molecules are held in the semiconductor layer;
that at least one first molecule of the multiple kinds of molecules comprises a polypyridine complex having a carboxyl group —COOH or a phosphono group —PO(OH)$_2$ and is the photosensitizing dye; and
that at least one second molecule of the multiple kinds of molecules comprises an aromatic polycyclic conjugated molecule having an electron donating group and an electron accepting group and is a molecule having a plurality of functional groups bound to the semiconductor layer and bound to the same carbon and controlling association of the photosensitizing dye, thereby enhancing photoelectric conversion efficiency of the photosensitizing dye.

14. The dye sensitization photoelectric converter according to claim 13, wherein the plurality of functional groups comprise a first functional group which is strongly bound to the semiconductor layer and a second functional group which is weakly bound to the semiconductor layer.

15. The dye sensitization photoelectric converter according to claim 14, wherein the functional group which is strongly bound to the semiconductor layer is the carboxyl group —COOH or the phosphono group —PO(OH)$_2$, and the functional group which is weakly bound to the semiconductor layer is a cyano group —CN, an amino group —NH$_2$, a thiol group —SH or a thione group —CS—.

16. A dye sensitization photoelectric converter configured such that light is absorbed by a photosensitizing dye held in a semiconductor layer and that an electron of the photosensitizing dye excited by this light absorption is taken out to the outside via the semiconductor layer,
which is characterized in that multiple kinds of molecules are held to the semiconductor layer;
that a first molecule of the multiple kinds of molecules comprises a polypyridine complex having a carboxyl group —COOH or a phosphono group —PO(OH)$_2$ and is the photosensitizing dye; and
that a second molecule of the multiple kinds of molecules comprises an aromatic polycyclic conjugated molecule having an electron donating group and an electron accepting group and has a cyano group —CN, an amino group —NH$_2$, a thiol group —SH or a thione group —CS— as well as a carboxyl group —COOH or a phosphono group —PO(OH)$_2$ bound to the same carbon.

17. A dye sensitization photoelectric converter configured such that light is absorbed by photosensitizing dye molecules held in a semiconductor layer where electrons of the photosensitizing dye molecules exit by this light absorption and is taken outside of the photoelectric converter via the semiconductor layer, which is characterized in that the photosensitizing dye molecules comprise a polypyridine complex having a carboxyl group —COOH or a phosphono group —PO(OH)$_2$ and an aromatic polycyclic conjugated molecule in which an electron donating group and an electron accepting group are linearly disposed, wherein the aromatic polycyclic conjugated molecule comprises a first functional group comprising a carboxyl group —COOH or a phosphono group —PO(OH)$_2$, and the aromatic polycyclic conjugated molecule comprises a second functional group comprising cyano group —CN, an amino group —NH$_2$, a thiol group —SH or a thione group —CS—, and wherein the first functional group and the second functional group are bound to the semiconductor layer and bound to the same carbon.

* * * * *